United States Patent
Kato et al.

(10) Patent No.: US 8,106,594 B2
(45) Date of Patent: Jan. 31, 2012

(54) SEMICONDUCTOR DEVICE AND ELECTRONIC APPARATUS USING THE SAME

(75) Inventors: Kiyoshi Kato, Isehara (JP); Takeshi Osada, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1421 days.

(21) Appl. No.: 11/354,841

(22) Filed: Feb. 16, 2006

(65) Prior Publication Data

US 2006/0192229 A1   Aug. 31, 2006

(30) Foreign Application Priority Data

Feb. 28, 2005   (JP) ................... 2005-055183

(51) Int. Cl.
G09G 3/10 (2006.01)
(52) U.S. Cl. ..................... 315/160; 315/169.3
(58) Field of Classification Search .......... 315/160, 315/169.6, 169.3
See application file for complete search history.

(56) References Cited

U.S. PATENT DOCUMENTS

| | | | |
|---|---|---|---|
| 5,416,446 A | 5/1995 | Holler et al. | |
| 5,594,391 A | 1/1997 | Yoshizawa | |
| 5,748,044 A | 5/1998 | Xue | |
| 5,841,170 A | 11/1998 | Adan et al. | |
| 5,849,043 A | 12/1998 | Zhang et al. | |
| 6,147,667 A | 11/2000 | Yamazaki et al. | |
| 6,154,100 A | 11/2000 | Okamoto | |
| 6,271,818 B1 | 8/2001 | Yamazaki et al. | |
| 6,759,875 B2 | 7/2004 | Mano et al. | |
| 2002/0011983 A1 | 1/2002 | Yamazaki et al. | |
| 2005/0001211 A1 | 1/2005 | Yamazaki et al. | |

FOREIGN PATENT DOCUMENTS

| | | |
|---|---|---|
| JP | 09-275332 A | 10/1997 |
| JP | 2000-077984 A | 3/2000 |
| JP | 2002-223149 | 8/2002 |
| JP | 2002-353781 A | 12/2002 |
| JP | 2004-247373 | 9/2004 |

OTHER PUBLICATIONS

Office Action (Application No. 200610051518.3) dated Mar. 18, 2010 with English translation.
"1.7 large signal characteristic of MOS field effect transistor," Design technology of Analog integrated circuit, vol. 1, Nov. 10, 1990, pp. 57-59, Baifukan Co., Ltd.

*Primary Examiner* — Matthew E Warren
*Assistant Examiner* — John Lin
(74) *Attorney, Agent, or Firm* — Eric J. Robinson; Robinson Intellectual Property Law Office, P.C.

(57) ABSTRACT

A semiconductor device with high function, multifunction and high added value. The semiconductor device includes a PLL circuit that is provided over a substrate and outputs a signal with a correct frequency. By providing such a PLL circuit over the substrate, a semiconductor device with high function, multifunction and high added value can be achieved.

88 Claims, 22 Drawing Sheets

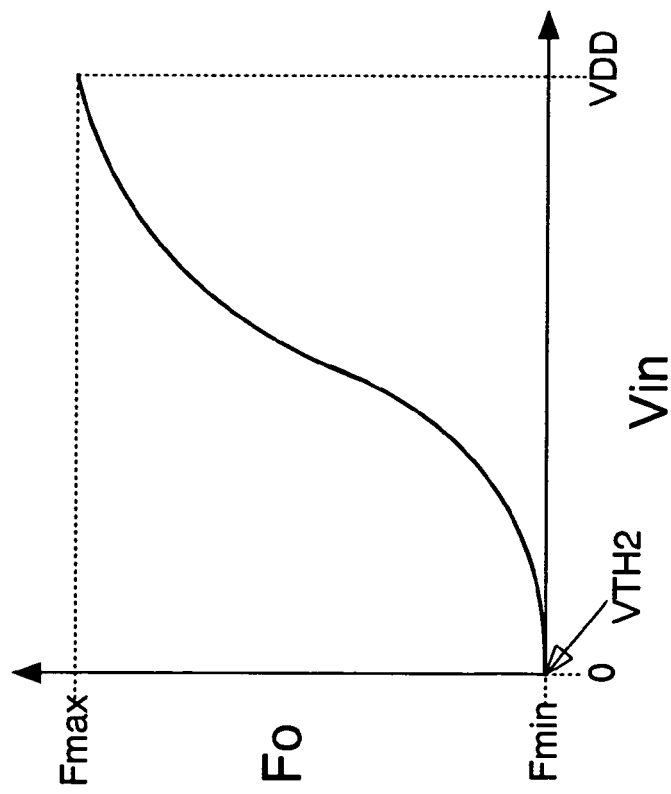
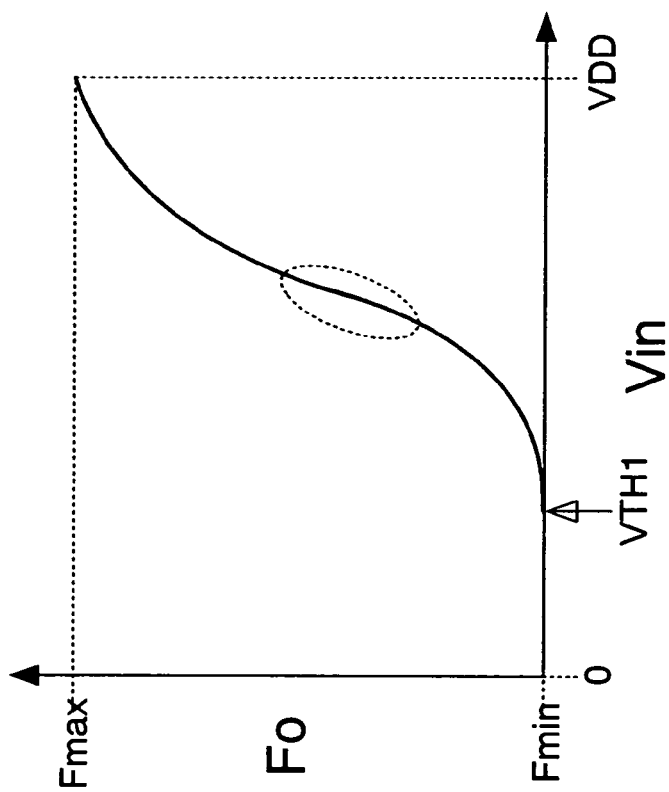

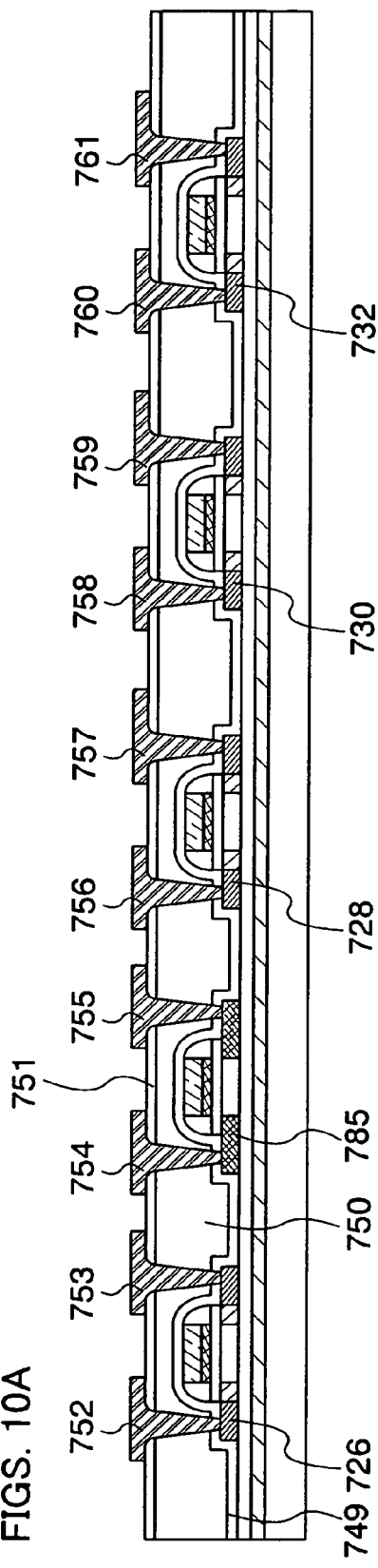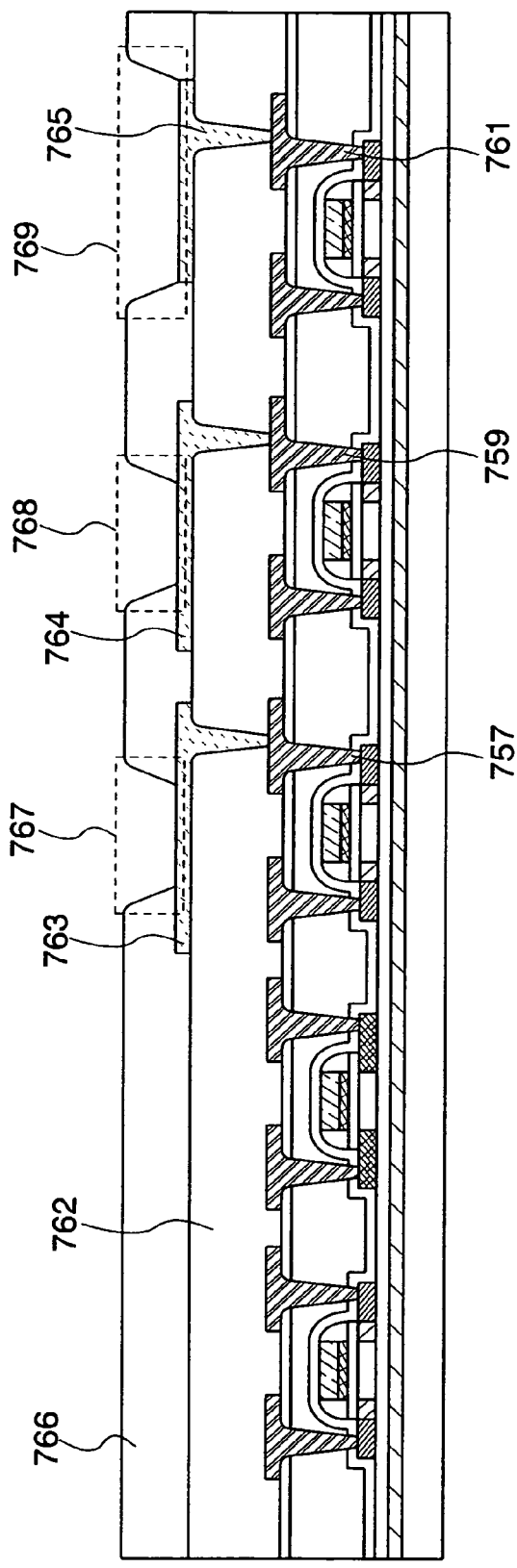

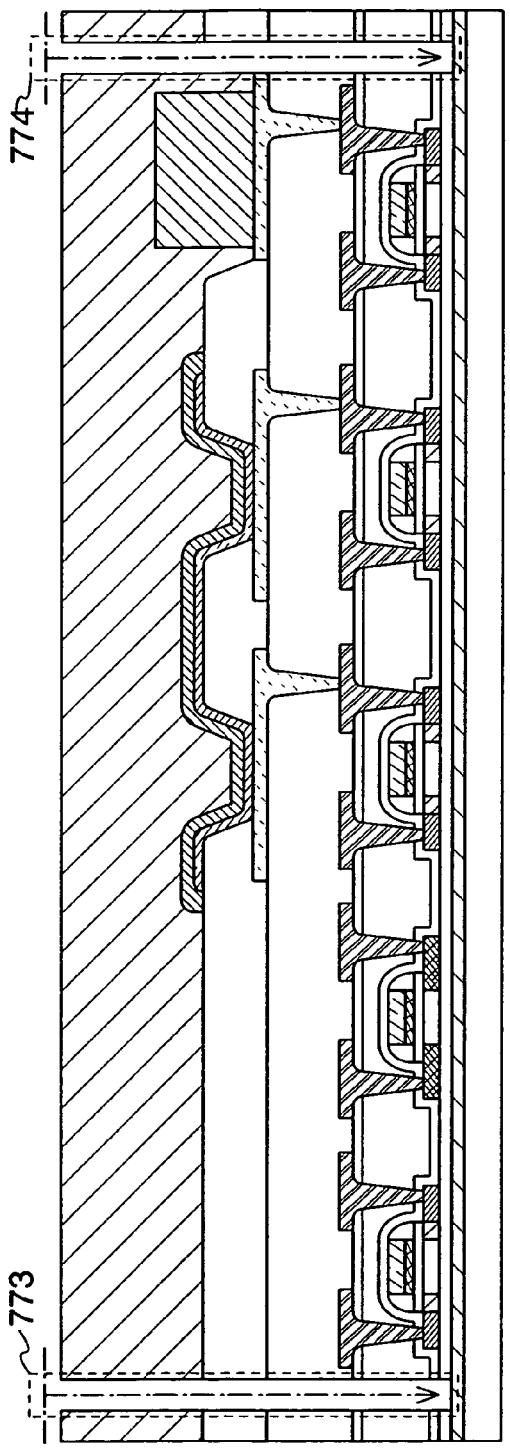
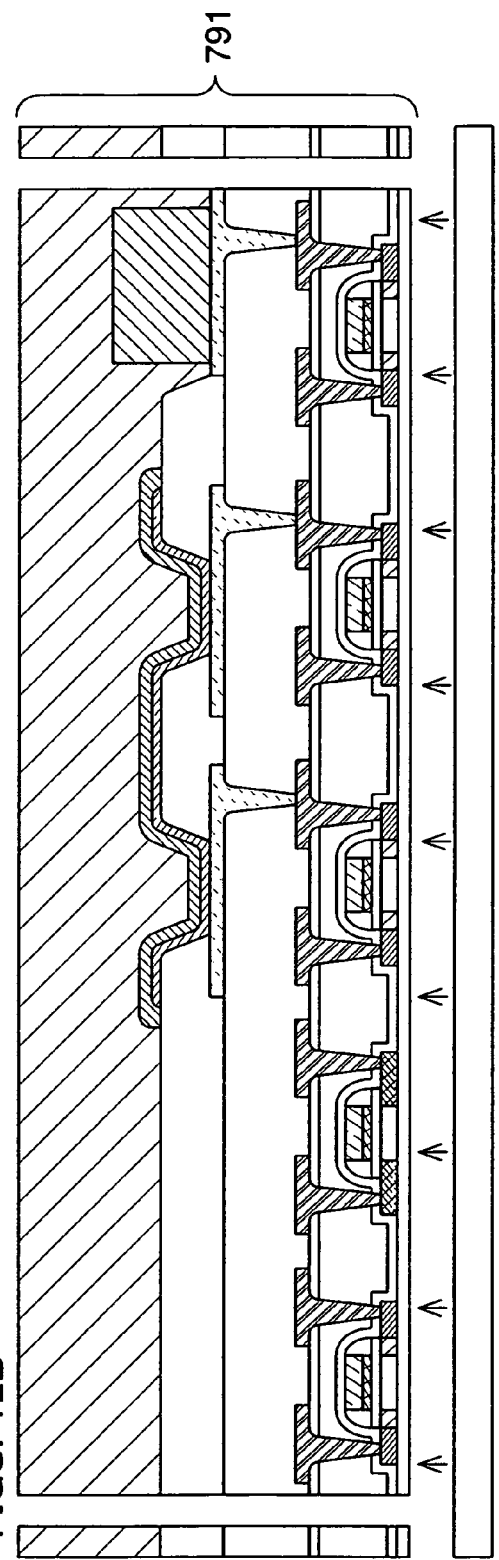
FIGS. 12A
FIGS. 12B

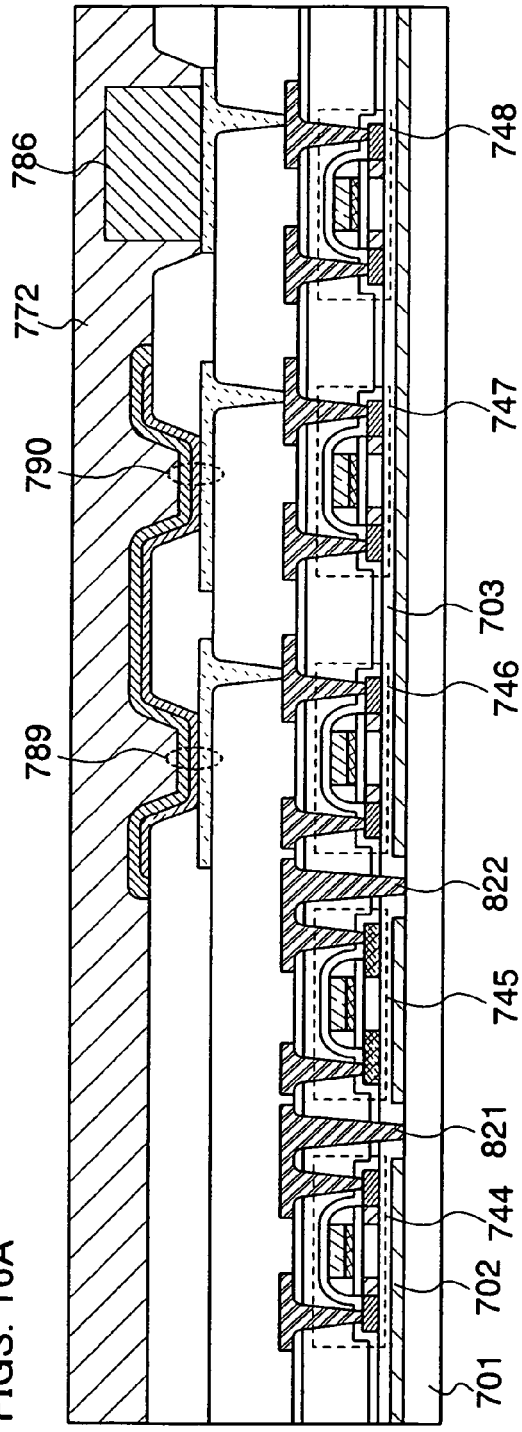
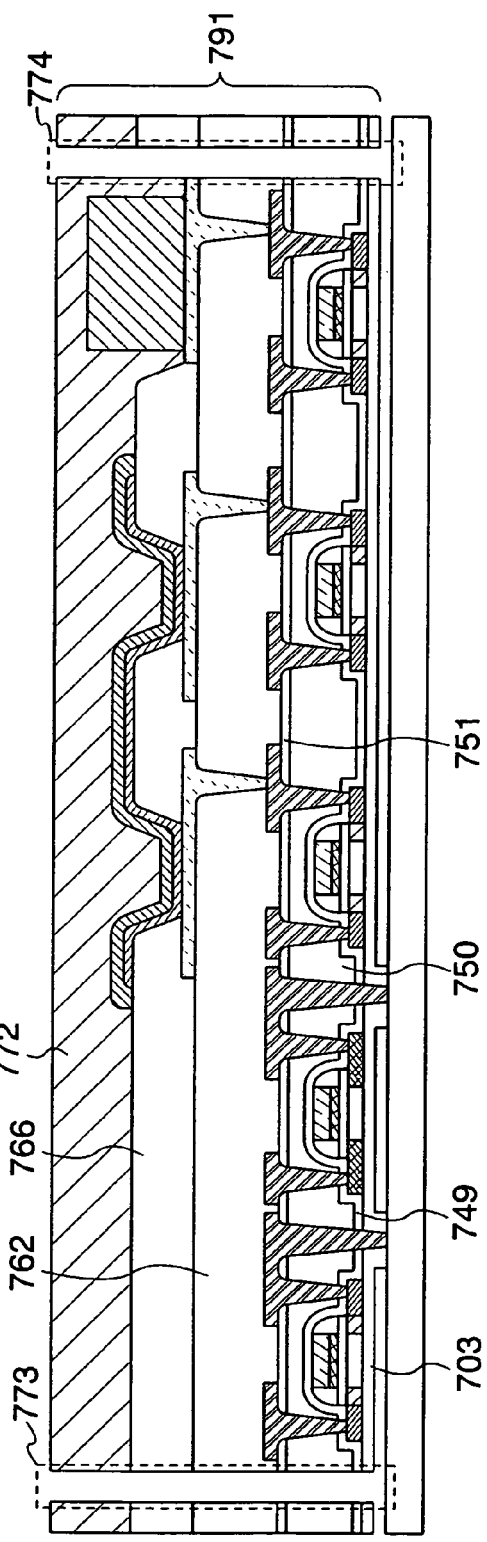
FIGS. 16A
FIGS. 16B

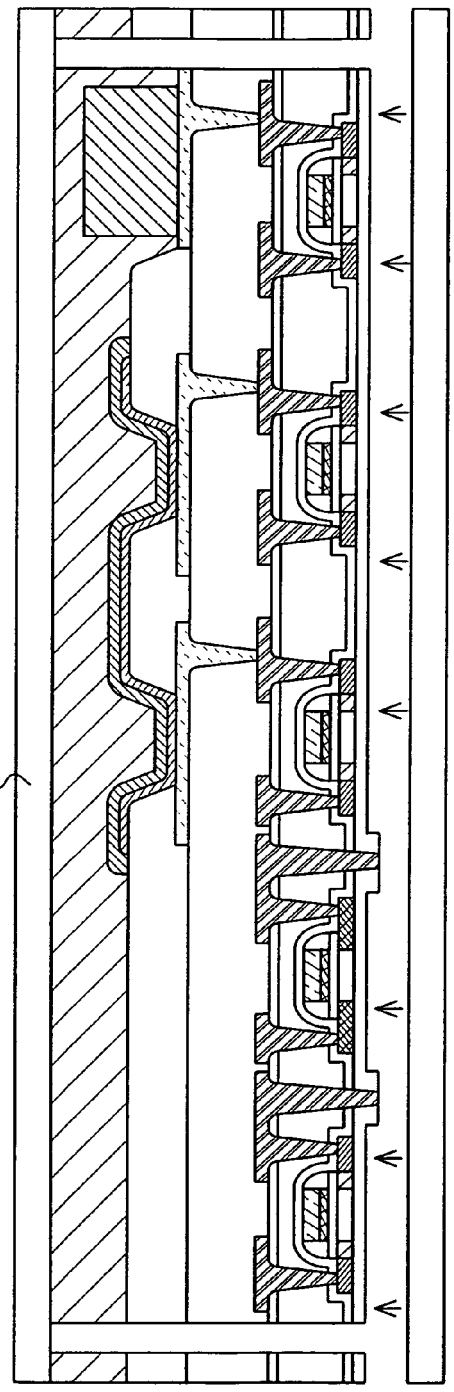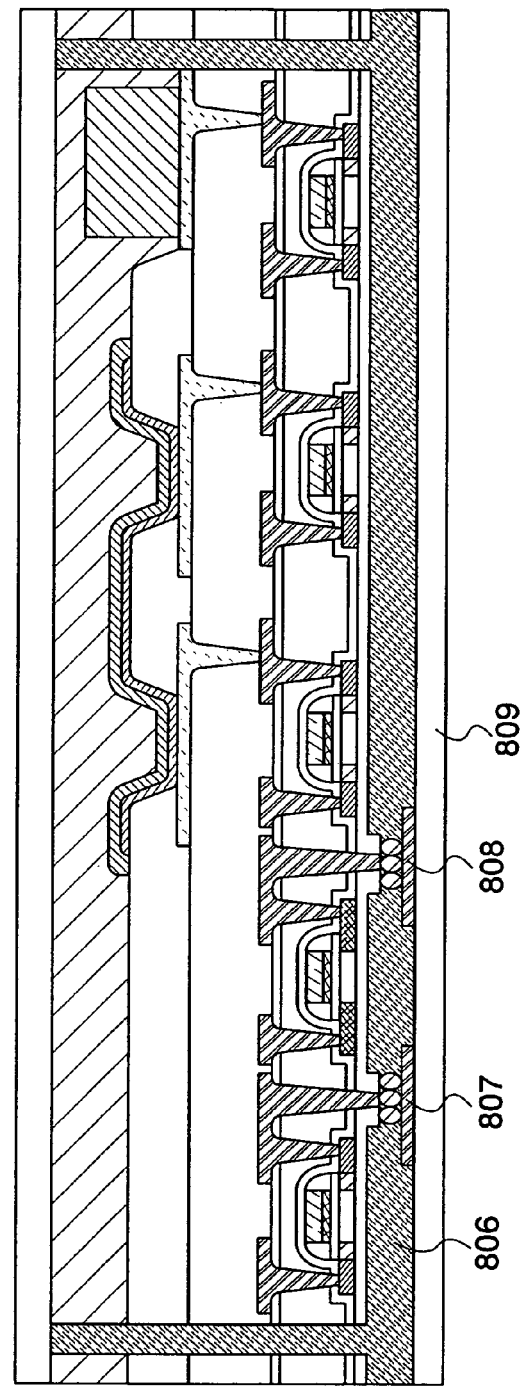
FIGS. 17A
FIGS. 17B

SEMICONDUCTOR DEVICE AND ELECTRONIC APPARATUS USING THE SAME

BACKGROUND OF THE INVENTION

1. Field of the Invention

The present invention relates to a semiconductor device having a thin film transistor that is formed over a substrate.

2. Description of the Related Art

In recent years, a semiconductor device where various circuits are integrated over the same insulating surface has been developed (for example, Patent Document 1).
[Patent Document 1] Japanese Patent Laid-Open No. 2004-247373

SUMMARY OF THE INVENTION

The invention provides a semiconductor device with high function, multifunction and high added value.

The invention provides a semiconductor device where a circuit outputting a signal with a correct frequency is provided over a substrate. As the circuit outputting a signal with a correct frequency, for example, a phase locked loop circuit (hereinafter also referred to as a PLL circuit) is used. The PLL circuit has a function of outputting a signal with a frequency that is a fixed multiple of the frequency of a supplied signal. According to the invention having such a PLL circuit over a substrate, a semiconductor device with high function, multifunction and high added value can be achieved.

A semiconductor device of the invention includes a low potential power supply; a high potential power supply; and a voltage controlled oscillator over a substrate. The voltage controlled oscillator circuit includes: a first circuit comprising a first N-type thin film transistor and a first P-type thin film transistor; a second circuit comprising a second N-type thin film transistor; a third circuit comprising a second P-type thin film transistor; and a fourth circuit comprising a third N-type thin film transistor and a third P-type thin film transistor.

In the semiconductor device having the aforementioned structure, one of a source and a drain of the first N-type thin film transistor is connected to one of a source and a drain of the first P-type thin film transistor, the other of the source and the drain of the first N-type thin film transistor is connected to one of a source and a drain of the second N-type thin film transistor, the other of the source and the drain of the first P-type thin film transistor is connected to one of a source and a drain of the second P-type thin film transistor, and one of a source and a drain of the third N-type thin film transistor is connected to one of a source and a drain of the third P-type thin film transistor.

In the semiconductor device having the aforementioned structure, the other of the source and the drain of the second N-type thin film transistor and the other of the source and the drain of the third N-type thin film transistor are connected to the low potential power supply, and the other of the source and the drain of the second P-type thin film transistor and the other of the source and the drain of the third P-type thin film transistor are connected to the high potential power supply. That is to say, the other of the source and the drain of the second N-type thin film transistor and the other of the source and the drain of the third N-type thin film transistor are kept at a fixed potential (low potential), while the other of the source and the drain of the second P-type thin film transistor and the other of the source and the drain of the third P-type thin film transistor are kept at a fixed potential (high potential).

In the semiconductor device having the aforementioned structure, the second N-type thin film transistor controls conduction between the first N-type thin film transistor and the low potential power supply, and the second P-type thin film transistor controls conduction between the first P-type thin film transistor and the high potential power supply. The threshold voltage of the second N-type thin film transistor and the third N-type thin film transistor is lower than that of the first N-type thin film transistor. When a first signal is inputted to a gate of the second N-type thin film transistor and a gate of the third N-type thin film transistor, a second signal is outputted from a node at which the first N-type thin film transistor is connected to the first P-type thin film transistor.

In the semiconductor device having the aforementioned structure, the channel length of each of the second N-type thin film transistors and the third N-type thin film transistor is shorter than that of each of the first N-type thin film transistors. The concentration of an impurity element imparting N-type conductivity in a channel forming region of a semiconductor layer included in each of the second N-type thin film transistors and the third N-type thin film transistor is higher than that in a channel forming region of a semiconductor layer included in each of the first N-type thin film transistors. The concentration of an impurity element imparting P-type conductivity in the channel forming region of the semiconductor layer included in each of the second N-type thin film transistors and the third N-type thin film transistor is lower than that in the channel forming region of the semiconductor layer included in each of the first N-type thin film transistors.

In the semiconductor device having the aforementioned structure, the first circuit comprises a plurality of the first N-type thin film transistors and a plurality of the first P-type thin film transistors, the second circuit comprises a plurality of the second N-type thin film transistors, the third circuit comprises a plurality of the second P-type thin film transistors, one of a source and a drain of each of the first N-type thin film transistors is connected to one of a source and a drain of each of the first P-type thin film transistors, the other of the source and the drain of each of the first N-type thin film transistors is connected to one of a source and a drain of each of the second N-type thin film transistors, the other of the source and the drain of each of the first P-type thin film transistors is connected to one of a source and a drain of each of the second P-type thin film transistors, the other of the source and the drain of each of the second N-type thin film transistors is connected to the low potential power supply, the other of the source and the drain of each of the second P-type thin film transistors is connected to the high potential power supply, a threshold voltage of each of the second N-type thin film transistors is lower than that of each of the first N-type thin film transistors, and a threshold voltage of the third N-type thin film transistor is lower than that of each of the first N-type thin film transistors.

A semiconductor device of the invention includes a low potential power supply; a high potential power supply; and a voltage controlled oscillator over a substrate. The voltage controlled oscillator circuit comprises a first circuit comprising a first N-type thin film transistor and a P-type thin film transistor; and a second circuit comprising a second N-type thin film transistor.

In the semiconductor device having the aforementioned structure, one of a source and a drain of the first N-type thin film transistor is connected to one of a source and a drain of the P-type thin film transistor, and the other of the source and the drain of the first N-type thin film transistor is connected to one of a source and a drain of the second N-type thin film transistor.

In the semiconductor device having the aforementioned structure, the other of the source and the drain of the second N-type thin film transistor is connected to the low potential power supply, and the other of the source and the drain of the second P-type thin film transistor is connected to the high potential power supply. That is to say, the other of the source and the drain of the second N-type thin film transistor is kept at a fixed potential (low potential), while the other of the source and the drain of the P-type thin film transistor is kept at a fixed potential (high potential).

In the semiconductor device having the aforementioned structure, the second N-type thin film transistor controls conduction between the first N-type thin film transistor and the low potential power supply. The threshold voltage of the second N-type thin film transistor is lower than that of the first N-type thin film transistor. When a first signal is inputted to a gate of the second N-type thin film transistor, a second signal is outputted from a node at which the first N-type thin film transistor is connected to the P-type thin film transistor.

In the semiconductor device having the aforementioned structure, the channel length of the second N-type thin film transistor is shorter than that of the first N-type thin film transistor. The concentration of an impurity element imparting N-type conductivity in a channel forming region of a semiconductor layer included in the second N-type thin film transistor is higher than that in a channel forming region of a semiconductor layer included in the first N-type thin film transistor. The concentration of an impurity element imparting P-type conductivity in a channel forming region of a semiconductor layer included in the second N-type thin film transistor is lower that in a channel forming region of a semiconductor layer included in the first N-type thin film transistor.

In the semiconductor device having the aforementioned structure, the first circuit comprises a plurality of the first N-type thin film transistors and a plurality of the P-type thin film transistors, the second circuit comprises a plurality of the second N-type thin film transistors, one of a source and a drain of each of the first N-type thin film transistors is connected to one of a source and a drain of each of the P-type thin film transistors, the other of the source and the drain of each of the first N-type thin film transistors is connected to one of a source and a drain of each of the second N-type thin film transistors, the other of the source and the drain of each of the second N-type thin film transistors is connected to the low potential power supply, the other of the source and the drain of each of the second P-type thin film transistors is connected to the high potential power supply, and a threshold voltage of each of the second N-type thin film transistors is lower than that of each of the first N-type thin film transistors.

A semiconductor device of the invention includes a low potential power supply; a high potential power supply; and a voltage controlled oscillator over a substrate. The voltage controlled oscillator circuit includes: a first circuit comprising a first N-type thin film transistor and a first P-type thin film transistor; a second circuit comprising a second N-type thin film transistor; a third circuit comprising a second P-type thin film transistor; and a fourth circuit comprising a third N-type thin film transistor and a third P-type thin film transistor.

In the semiconductor device having the aforementioned structure, wherein one of a source and a drain of the first N-type thin film transistor is connected to one of a source and drain of the first P-type thin film transistor, the other of the source and the drain of the first N-type thin film transistor is connected to one of a source and a drain of the second N-type thin film transistor, the other of the source and the drain of the first P-type thin film transistor is connected to one of a source and a drain of the second P-type thin film transistor, and one of a source and a drain of the third N-type thin film transistor is connected to one of a source and a drain of the third P-type thin film transistor.

In the semiconductor device having the aforementioned structure, the other of the source and the drain of the second N-type thin film transistor and the other of the source and the drain of the third N-type thin film transistor are connected to the low potential power supply. The other of the source and the drain of the second P-type thin film transistor and the other of the source and the drain of the third P-type thin film transistor are connected to the high potential power supply. That is to say, the other of the source and the drain of the second N-type thin film transistor and the other of the source and the drain of the third N-type thin film transistor are kept at a fixed potential (low potential), while the other of the source and the drain of the second P-type thin film transistor and the other of the source and the drain of the third P-type thin film transistor are kept at a fixed potential (high potential).

In the semiconductor device having the aforementioned structure, the second N-type thin film transistor controls conduction between the first N-type thin film transistor and the low potential power supply, and the second P-type thin film transistor controls conduction between the first P-type thin film transistor and the high potential power supply. The threshold voltage of the second P-type thin film transistor and the third P-type thin film transistor is higher than that of the first P-type thin film transistor. When a first signal is inputted to a gate of the second P-type thin film transistor and a gate of the third P-type thin film transistor, a second signal is outputted from a node at which the first N-type thin film transistor is connected to the first P-type thin film transistor.

In the semiconductor device having the aforementioned structure, the channel length of the second P-type thin film transistor and the third P-type thin film transistor is shorter than that of the first P-type thin film transistor. The concentration of an impurity element imparting P-type conductivity in a channel forming region of a semiconductor layer included in the second P-type thin film transistor and the third P-type thin film transistor is higher than that in a channel forming region of a semiconductor layer included in the first P-type thin film transistor. The concentration of an impurity element imparting N-type conductivity in a channel forming region of a semiconductor layer included in the second P-type thin film transistor and the third P-type thin film transistor is lower than that in a channel forming region of a semiconductor layer included in the first P-type thin film transistor.

In the semiconductor device having the aforementioned structure, the first circuit comprises a plurality of the first N-type thin film transistors and a plurality of the first P-type thin film transistors, the second circuit comprising a plurality of the second N-type thin film transistors, the third circuit comprises a plurality of the second P-type thin film transistors, one of a source and a drain of each of the first N-type thin film transistors is connected to one of a source and drain of each of the first P-type thin film transistors, the other of the source and the drain of each of the first N-type thin film transistors is connected to one of a source and a drain of each of the second N-type thin film transistors, the other of the source and the drain of each of the first P-type thin film transistors is connected to one of a source and a drain of each of the second P-type thin film transistors, the other of the source and the drain of each of the second N-type thin film transistors is connected to the low potential power supply, the other of the source and the drain of each of the second P-type thin film transistors is connected to the high potential power supply, a threshold voltage of each of the second P-type thin film transistors is higher than that of each of the first P-type thin film transistors, and a threshold voltage of the third P-type thin film transistor is higher than that of each of the first P-type thin film transistors.

A semiconductor device of the invention includes a low potential power supply; a high potential power supply; and a voltage controlled oscillator over a substrate. The voltage controlled oscillator circuit includes: a first circuit comprising a of N-type thin film transistor and a first P-type thin film transistor; and a second circuit comprising a second P-type thin film transistor.

In the semiconductor device having the aforementioned structure, one of a source and a drain of the first P-type thin film transistor is connected to one of a source and a drain of the N-type thin film transistor, and the other of the source and the drain of the first P-type thin film transistor is connected to one of a source and a drain of the second P-type thin film transistor.

In the semiconductor device having the aforementioned structure, the other of the source and the drain of the second P-type thin film transistor is connected to the high potential power supply, and the other of the source and the drain of the N-type thin film transistor is connected to the low potential power supply. That is to say, the other of the source and the drain of the second P-type thin film transistor is kept at a fixed potential, while the other of the source and the drain of the N-type thin film transistor is kept at a fixed potential.

In the semiconductor device having the aforementioned structure, the second P-type thin film transistor controls conduction between the first P-type thin film transistor and the high potential power supply. The threshold voltage of the second P-type thin film transistor is higher than that of the first P-type thin film transistor. When a first signal is inputted to a gate of the second P-type thin film transistor, a second signal is outputted from a node at which the first N-type thin film transistor is connected to the first P-type thin film transistor.

In the semiconductor device having the aforementioned structure, the channel length of the second P-type thin film transistor is shorter than that of the first P-type thin film transistor. The concentration of an impurity element imparting P-type conductivity in a channel forming region of a semiconductor layer included in the second P-type thin film transistor is higher than that in a channel forming region of a semiconductor layer included in the first P-type thin film transistor. The concentration of an impurity element imparting N-type conductivity in a channel forming region of a semiconductor layer included in the second P-type thin film transistor is lower than that in a channel forming region of a semiconductor layer included in the first P-type thin film transistor.

In the semiconductor device having the aforementioned structure, wherein the first circuit comprising a plurality of the N-type thin film transistors and a plurality of the first P-type thin film transistors, the second circuit comprising a plurality of the second P-type thin film transistor, one of a source and a drain of each of the first P-type thin film transistors is connected to one of a source and a drain of each of the N-type thin film transistors, the other of the source and the drain of each of the first P-type thin film transistors is connected to one of a source and a drain of each of the second P-type thin film transistors, the other of the source and the drain of each of the second P-type thin film transistors is connected to the high potential power supply, the other of the source and the drain of each of the N-type thin film transistors is connected to a low potential power supply, and a threshold voltage of each of the second P-type thin film transistors is higher than that of each of the first P-type thin film transistors.

In the aforementioned structures, the substrate included in the semiconductor device of the invention is formed of glass or plastic. If the substrate is formed of glass, mass production and cost reduction can be achieved more easily than the case of using a single crystalline substrate. If the substrate is formed of plastic, it can be processed into a good design and flexible shape as it is thin and lightweight and can be bent.

A phase comparator, a loop filter and a divider are provided over the substrate included in the semiconductor device of the invention.

An antenna is provided over the substrate included in the semiconductor device of the invention. Accordingly, it is possible to provide a semiconductor device transmitting, receiving, or transmitting and receiving electromagnetic waves by utilizing the antenna.

A pixel portion having a plurality of pixels is provided over the substrate included in the semiconductor device of the invention. Each of the plurality of pixels has a liquid crystal element or a light emitting element. Accordingly, it is possible to provide a semiconductor device with high function, multifunction and high added value, which has a function of displaying images.

The invention also provides an electronic apparatus using a semiconductor device having any one of the aforementioned structures.

According to the invention having over a substrate a PLL circuit that has a function of keeping the frequency of an outputting signal constant and controlling the frequency of an outputting signal, a semiconductor device with high function, multifunction and high added value can be provided. By utilizing the functions of the PLL circuit, for example, the frequency of an inputted signal can be increased, and when a signal with the increased frequency is supplied to another circuit, the circuit can operate at a higher speed. The PLL circuit also has a function of outputting a signal with a correct frequency by synchronizing an inputted signal with an average frequency even when the frequency of the inputted signal is incorrect. When utilizing this function, operation error of the circuit can be prevented.

BRIEF DESCRIPTION OF DRAWINGS

FIGS. 6A and 6B are diagrams each showing a structure of a semiconductor device of the invention.

FIGS. 10A and 10B are diagrams each showing a manufacturing step of a semiconductor device of the invention.

FIGS. 12A and 12B are diagrams each showing a manufacturing step of a semiconductor device of the invention.

FIGS. 16A and 16B are diagrams each showing a manufacturing step of a semiconductor device of the invention.

FIGS. 17A and 17B are diagrams each showing a manufacturing step of a semiconductor device of the invention.

DETAILED DESCRIPTION OF THE INVENTION

Embodiment Mode

Figure 1:
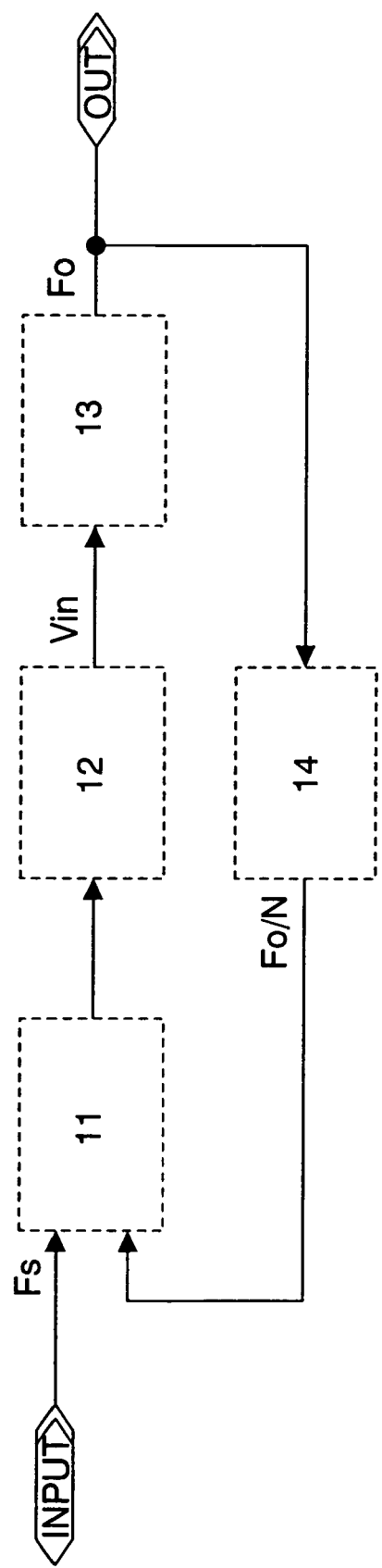
FIG. 1 is a diagram showing a structure of a semiconductor device of the invention.

Although the invention will be described by way of Embodiment Mode and Embodiments with reference to the accompanying drawings, it is to be understood that various changes and modifications will be apparent to those skilled in the art. Therefore, unless such changes and modifications depart from the scope of the invention, they should be construed as being included therein. Note that in the following structures of the invention, the identical portions are denoted by the same reference numeral in different drawings.

A structure of a semiconductor device of the invention is described with reference to FIG. 1. The semiconductor device of the invention includes a phase comparator 11, a loop filter 12, a voltage controlled oscillator (also simply referred to as a VCO) 13, and a divider 14.

The phase comparator 11 compares the phase of a signal Fs that is externally inputted and the phase of a signal Fo/N that is inputted from the divider 14. The loop filter 12 generates a signal by removing the AC component of a signal that is supplied from the phase comparator 11. The voltage controlled oscillator 13 outputs a signal Fo based on a signal Vin that is inputted from the loop filter 12. The divider 14 outputs a signal Fo/N that is obtained by dividing a signal Fo inputted from the voltage controlled oscillator 13 by N.

The semiconductor device of the invention includes the voltage controlled oscillator 13. The phase comparator 11, the loop filter 12 and the divider 14 are appropriately provided depending on the application. The semiconductor device of the invention may have other elements, for example, such as a crystal controlled oscillator, a prescaler and a swallow counter.

The phase comparator 11, the loop filter 12, the voltage controlled oscillator 13, and the divider 14 are provided over the same substrate. Each of the phase comparator 11, the voltage controlled oscillator 13 and the divider 14 includes at least one or more of a thin film transistor, a capacitor and a resistor. The loop filter 12 includes at least one or both of a resistor and a capacitor.

The substrate is formed of glass or plastic. If the substrate is formed of glass, mass production and cost reduction can be achieved more easily than the case of using a single crystalline substrate. This is because a single crystalline substrate has a circular shape with a diameter of not more than about 30 cm, and it is more expensive than a glass substrate and the like. If the substrate is formed of plastic, it can be processed into a good design and flexible shape as it is thin and lightweight and can be bent. In addition, a plastic substrate has high impact resistance and can be attached to and incorporated in various products, leading to applications in various fields. It is to be noted that plastic is a generic term for organic polymers, which is represented by, for example, a phenol resin, a melamine resin, polyethylene, polyvinyl chloride, polyether amide, polyether sulfone, acrylic, polyvinylidene chloride, and the like.

Figure 2:
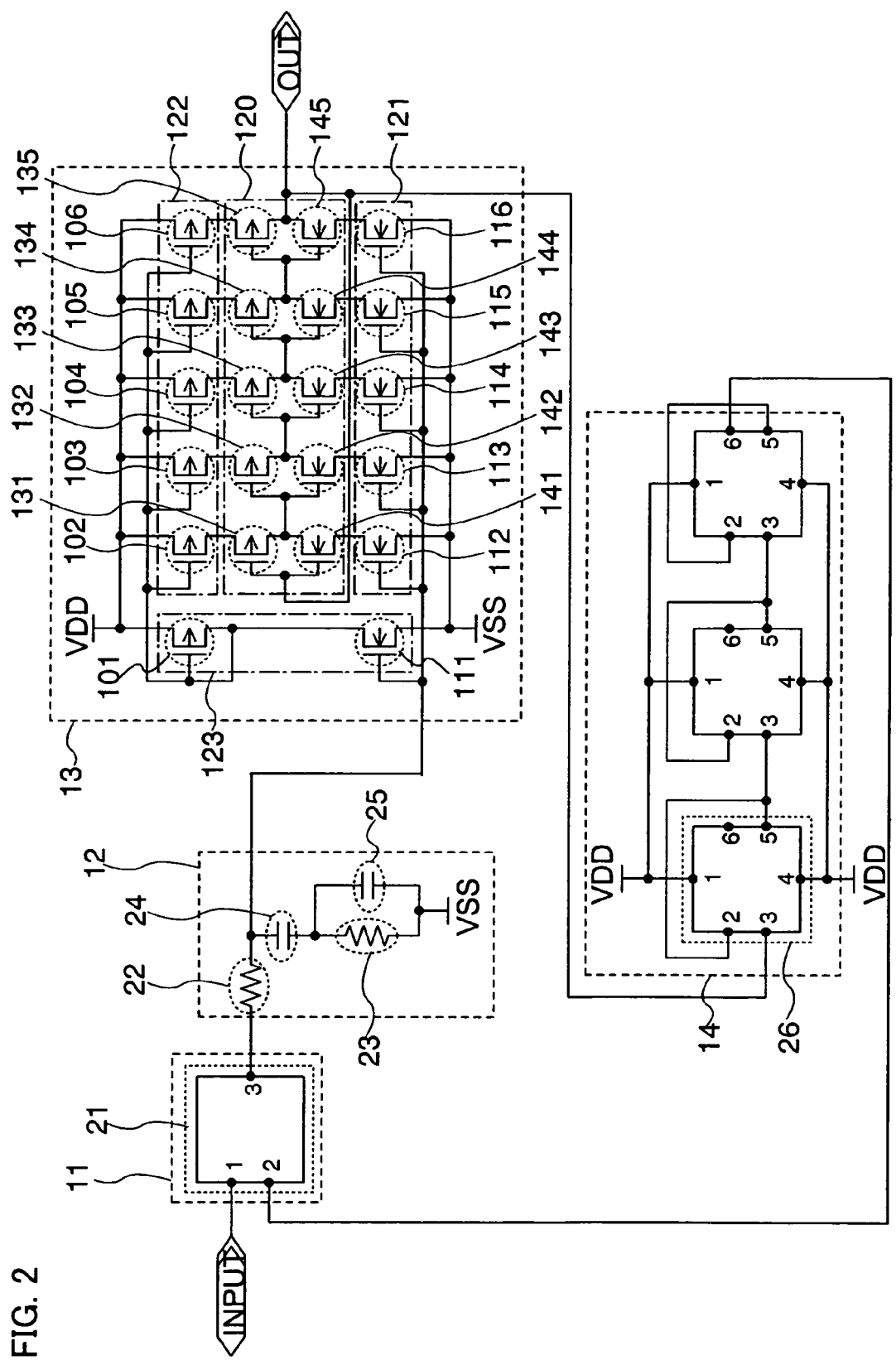
FIG. 2 is a diagram showing a structure of a semiconductor device of the invention.

Next, an equivalent circuit of the semiconductor device having the aforementioned structure is described with reference to FIG. 2. The phase comparator 11 includes a unit circuit 21. The loop filter 12 includes resistors 22 and 23 and capacitors 24 and 25. The loop filter 12 shown here is a lag-lead filter; however, the invention is not limited to this structure and other elements, for example, such as a lag filter may be used as well. The divider 14 includes three unit circuits 26 and is a divide-by-8 circuit. Note that the number of the unit circuits 26 included in the divider 14 is not particularly limited.

The lag-lead filter is a filter that is constituted by two resistors and one capacitor. The lag filter is a filter that is constituted by one resistor and one capacitor.

The voltage controlled oscillator 13 includes a circuit 120 (also referred to as a first circuit) including a plurality of pairs of a first N-type thin film transistor and a first P-type thin film transistor that are connected in series to each other, a circuit 121 (also referred to as a second circuit) including a plurality of second N-type thin film transistors that are connected in series to the first N-type thin film transistors, a circuit 122 (also referred to as a third circuit) including a plurality of second P-type thin film transistors that are connected in series to the first P-type thin film transistors, and a circuit 123 (also referred to as a fourth circuit) including a third N-type thin film transistor and a third P-type thin film transistor that are connected in series to each other.

In the shown structure, the circuit 120 includes a first N-type thin film transistor 141 and a first P-type thin film transistor 131 that are connected in series to each other, a first N-type thin film transistor 142 and a first P-type thin film transistor 132 that are connected in series to each other, a first N-type thin film transistor 143 and a first P-type thin film transistor 133 that are connected in series to each other, and a first N-type thin film transistor 145 and a first P-type thin film transistor 135 that are connected in series to each other.

The circuit 121 includes a plurality of second N-type thin film transistors 112 to 116, and the circuit 122 includes a plurality of second P-type thin film transistors 102 to 106. The plurality of second N-type thin film transistors 112 to 116 control conduction between the first N-type thin film transistors 141 to 145 and a low potential power supply (VSS) respectively. The plurality of second P-type thin film transistors 102 to 106 control conduction between the first P-type thin film transistors 131 to 135 and a high potential power supply (VDD) respectively.

The circuit 123 includes a third P-type thin film transistor 101 and a third N-type thin film transistor 111. The circuit 123 controls conduction between the loop filter 12 and the circuits 121 and 122.

The aforementioned structure shows the case of five stages if it is assumed that one stage is the serially connected four transistors: the second P-type thin film transistor 102, the first P-type thin film transistor 131, the first N-type thin film transistor 141, and the second N-type thin film transistor 112. However, the invention is not limited to this structure. The voltage controlled oscillator 13 may have a structure with an odd number of stages of three or more.

The gate of the third P-type thin film transistor 101 is connected to one of the source and the drain thereof, and the other of the source and the drain of the third P-type thin film transistor 101 is connected to a high potential power supply (VDD). A gate of the third N-type thin film transistor 111 is connected to the loop filter 12, and one of a source and a drain thereof is connected to a low potential power supply (VSS).

In the aforementioned structure, the threshold voltage of each of the second N-type thin film transistors 112 to 116 and the third N-type thin film transistor 111 is lower than that of each of the first N-type thin film transistors 141 to 145 and N-type thin film transistors in other circuits. The N-type thin film transistors in other circuits are N-type thin film transistors included in the phase comparator 11 and the divider 14.

In order that the threshold voltage of each of the second N-type thin film transistors 112 to 116 and the third N-type thin film transistor 111 is thus lower than that of each of the first N-type thin film transistors 141 to 145 and the N-type thin film transistors in other circuits, the channel length of each transistor is appropriately designed. Specifically, the channel length of each of the second N-type thin film transistors 112 to 116 and the third N-type thin film transistor 111 is designed to be shorter than that of each of the first N-type thin film transistors 141 to 145 and the N-type thin film transistors in other circuits.

Instead, the concentration of an impurity element imparting N-type conductivity in a channel forming region of a semiconductor layer included in each of the second N-type thin film transistors 112 to 116 and the third N-type thin film transistor 111 is set higher than that included in each of the first N-type thin film transistors 141 to 145 and the N-type thin film transistors in other circuits. Note that the impurity element imparting N-type conductivity specifically corresponds to phosphorus (P) or arsenic (As).

Alternatively, the concentration of an impurity element imparting P-type conductivity in a channel forming region of a semiconductor layer included in each of the second N-type thin film transistors 112 to 116 and the third N-type thin film transistor 111 is set lower than that included in each of the first N-type thin film transistors 141 to 145 and the N-type thin film transistors in other circuits. Note that the impurity element imparting P-type conductivity corresponds to boron (B).

According to the invention having the aforementioned structure, the performance of the voltage controlled oscillator 13 can be improved. Specifically, the aforementioned voltage controlled oscillator 13 outputs a signal Fo from one of a source and a drain of the first N-type thin film transistor 145 and one of a source and a drain of the first P-type thin film transistor 135, when a signal Vin is inputted to the second N-type thin film transistors 112 to 116 and the third N-type thin film transistor 111. In addition, according to the invention, the range of a valid signal Vin can be increased. This effect is described below with reference to FIGS. 6A and 6B each showing a graph of the relation between the signal Vin inputted to the voltage controlled oscillator 13 and the signal Fo outputted from the voltage controlled oscillator 13.

The signal Vin inputted to the voltage controlled oscillator 13 varies from 0 to VDD (VDD here is the potential of a high potential power supply). The signal Vin inputted to the voltage controlled oscillator 13 is inputted to the gate electrode of each of the second N-type thin film transistors 112 to 116 and the third N-type thin film transistor 111. Accordingly, if the voltage of the signal Vin is lower than the threshold voltage (VTH1) of each of the second N-type thin film transistors 112 to 116 and the third N-type thin film transistor 111, an output signal is not outputted in some cases (see FIG. 6B). In addition, in the graph showing the relation between the signal Vin and the signal Fo, a part of the characteristic curve becomes steep. When a part of the characteristic curve is steep, the frequency of an outputted signal easily varies, which may prevent normal operation.

Such a defect is caused by the fact that the voltage controlled oscillator 13 is constituted by thin film transistors and is a circuit for processing an analog signal. That is to say, although the characteristics (threshold voltage, mobility and the like) of a thin film transistor may vary, the phase comparator 11 and the divider 14 are not easily influenced by variations in characteristics of a thin film transistor as they are controlled by a digital signal. Meanwhile, the voltage controlled oscillator 13 is controlled by an analog signal; therefore, it is easily influenced by variations in characteristics of a thin film transistor.

Thus, according to the invention having the aforementioned structure, the threshold voltage of each of the second N-type thin film transistors 112 to 116 and the third N-type thin film transistor 111 is set lower than that of each of the other transistors. In other words, according to the invention having the aforementioned structure, the threshold voltage (VTH2) of each of the second N-type thin film transistors 112 to 116 and the third N-type thin film transistor 111 is lower than the voltage of the signal Vin, leading to increased range of the valid signal Vin (see FIG. 6A). In addition, the characteristic curve is not steep, and the frequency of an outputted signal does not vary easily. As a result, an advantageous effect that the performance of the voltage controlled oscillator 13 is improved can be brought out.

Figure 3:
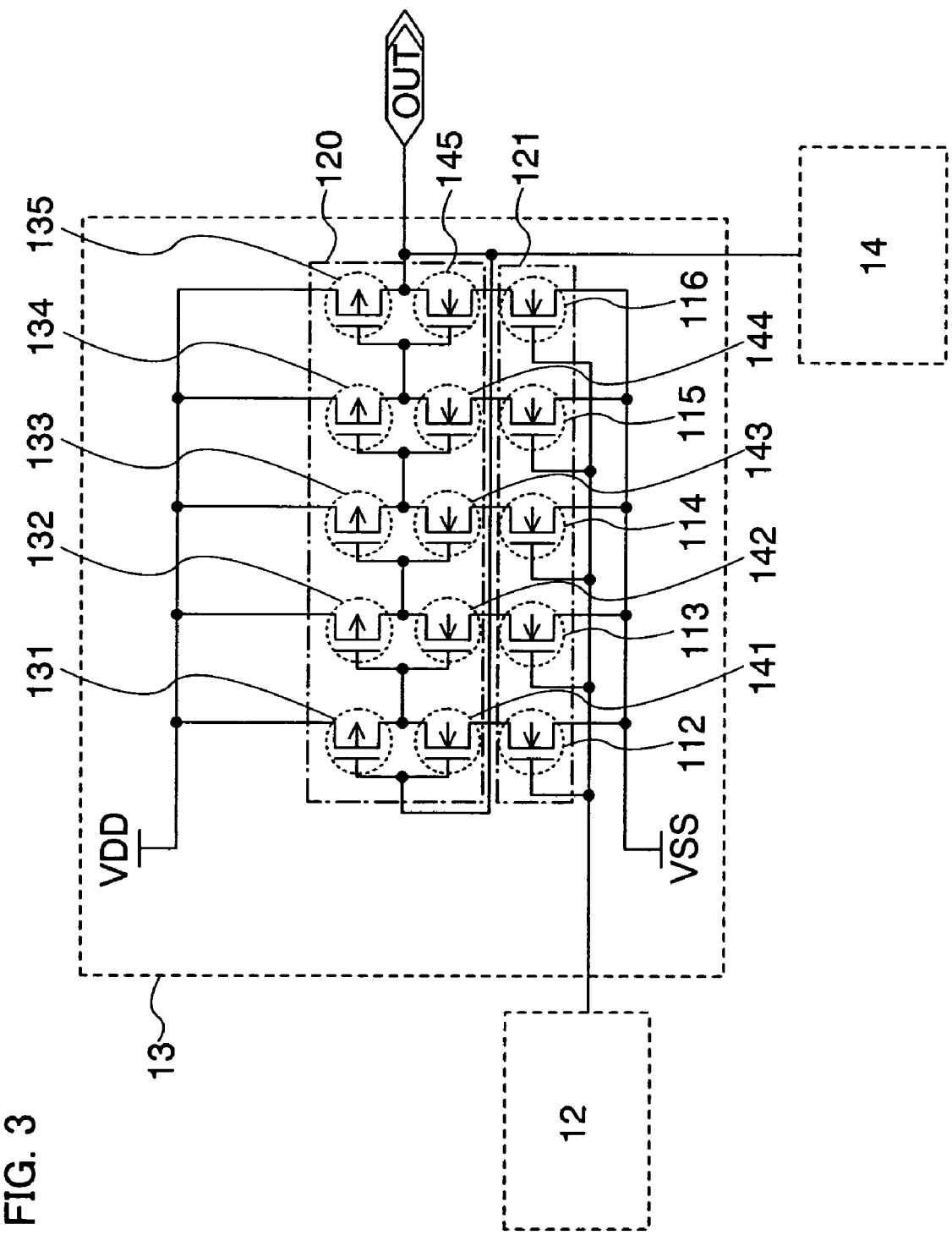
FIG. 3 is a diagram showing a structure of a semiconductor device of the invention.

The voltage controlled oscillator 13 having a structure different from the aforementioned one is described with reference to FIG. 3. The voltage controlled oscillator 13 includes the circuit 120 (also referred to as a first circuit) and the circuit 121 (also referred to as a second circuit). Differently from the structure shown in FIG. 2, the second P-type thin film transistors 102 to 106, the third P-type thin film transistor 101 and the third N-type thin film transistor 111 are not provided. Since this structure uses a smaller number of elements, size and weight can be reduced due to reduction in the area occupied by elements, and yield can be increased due to reduction in the number of elements.

The voltage controlled oscillator 13 having a structure different from the aforementioned one is described with reference to FIG. 4. The voltage controlled oscillator 13 includes the circuit 120 (also referred to as a first circuit), the circuit 121 (also referred to as a second circuit) and the circuit 123 (also referred to as a third circuit). Differently from the structure shown in FIG. 2, a signal supplied from the loop filter 12 is inputted to the second P-type thin film transistors 102 to 106 and the third P-type thin film transistor 101, and the gate electrode and the drain electrode of the third N-type thin film transistor 111 are connected to each other.

The voltage controlled oscillator 13 having a structure different from the aforementioned one is described with reference to FIG. 5. The voltage controlled oscillator 13 includes the circuit 120 (also referred to as a first circuit) and the circuit 122 (also referred to as a second circuit). Differently from the structure shown in FIG. 4, the second N-type thin film transistors 112 to 116, the third N-type thin film transistor 111, and the third P-type thin film transistor 101 are not provided. Since this structure uses a smaller number of elements, size and weight can be reduced due to reduction in the area occupied by elements, and yield can be increased due to reduction in the number of elements.

Figure 4:
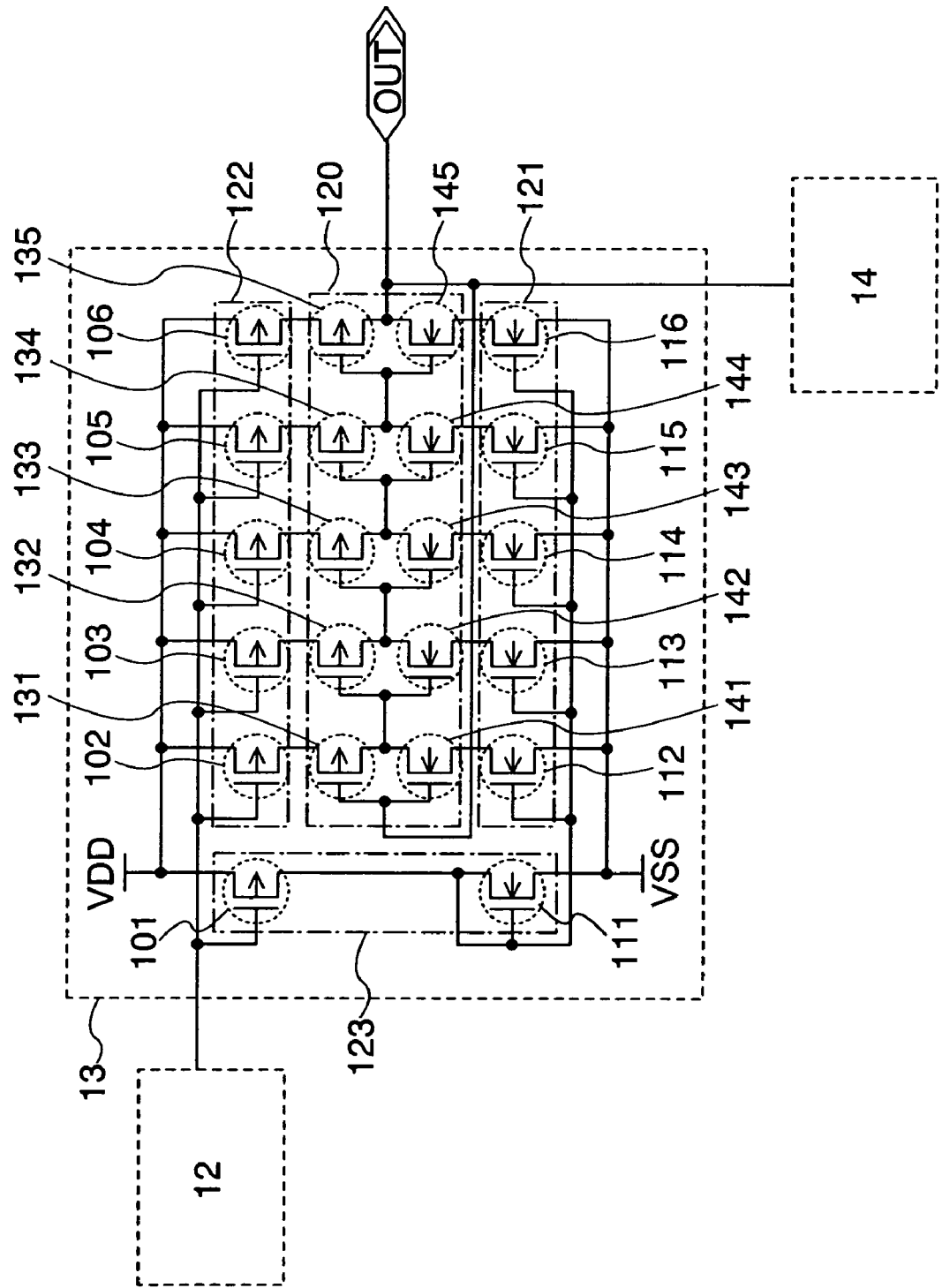
FIG. 4 is a diagram showing a structure of a semiconductor device of the invention.
Figure 5:
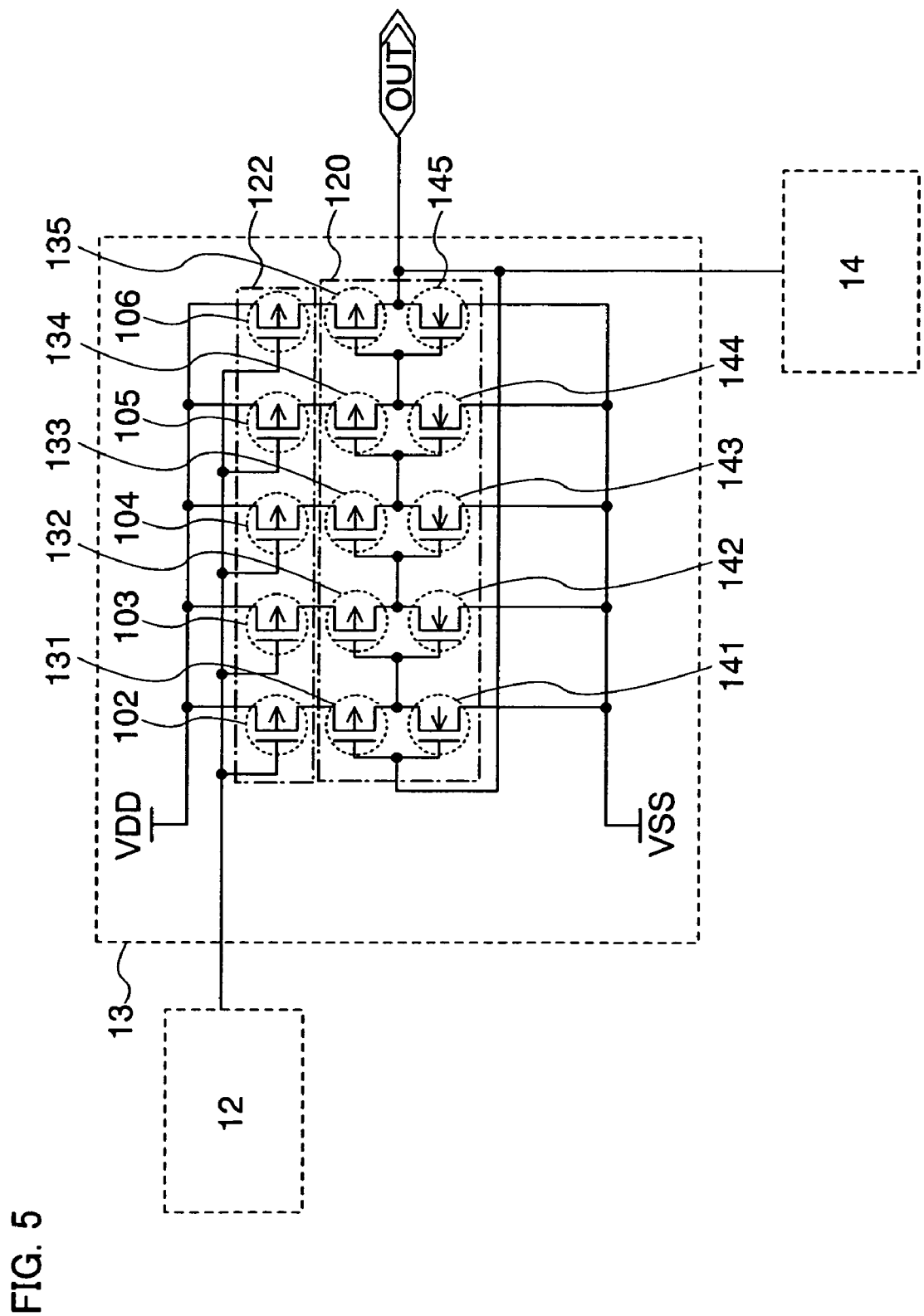
FIG. 5 is a diagram showing a structure of a semiconductor device of the invention.

In the aforementioned structures shown in FIGS. 4 and 5, the threshold voltage of each of the second P-type thin film transistors 102 to 106 and the third P-type thin film transistor 101 is higher than that of each of the first P-type thin film transistors 131 to 135 and P-type thin film transistors in other circuits. The P-type thin film transistors in other circuits are P-type thin film transistors included in the phase comparator 11 and the divider 14.

In order that the threshold voltage of each of the second P-type thin film transistors 102 to 106 and the third P-type thin film transistor 101 is thus higher than that of each of the first P-type thin film transistors 131 to 135 and the P-type thin film transistors in other circuits, the channel length of each transistor is appropriately designed. Specifically, the channel length of each of the second P-type thin film transistors 102 to 106 and the third P-type thin film transistor 101 is designed to be shorter than that of each of the first P-type thin film transistors 131 to 135 and the P-type thin film transistors in other circuits.

Instead, the concentration of an impurity element in a channel forming region of a semiconductor layer included in each of the second P-type thin film transistors 102 to 106 and the third P-type thin film transistor 101 is set higher than that included in each of the first P-type thin film transistors 131 to 135 and the P-type thin film transistors in other circuits. Note that the impurity element is an element imparting P-type conductivity, which specifically corresponds to boron (B).

Alternatively, the concentration of an impurity element in a channel forming region of a semiconductor layer included in each of the second P-type thin film transistors 102 to 106 and the third P-type thin film transistor 101 is set lower than that included in each of the first P-type thin film transistors 131 to 135 and the P-type thin film transistors in other circuits. Note that the impurity element is an element imparting N-type conductivity, which specifically corresponds to phosphorus or arsenic.

The transistors included in the voltage controlled oscillator 13 are connected to a high potential power supply (VDD) and a low potential power supply (VSS). The high potential power supply and the low potential power supply may be formed over the same substrate as the voltage controlled oscillator 13, or a different substrate.

In this specification, when an N-type thin film transistor has a smaller threshold voltage than another N-type thin film transistor, it means that the absolute value of the threshold voltage of an N-type thin film transistor is smaller than that of another N-type thin film transistor. And, when a P-type thin film transistor has a higher threshold voltage than another P-type thin film transistor, it means that the absolute value of the threshold voltage of a P-type thin film transistor is smaller than that of another P-type thin film transistor.

Embodiment 1

Figure 7:
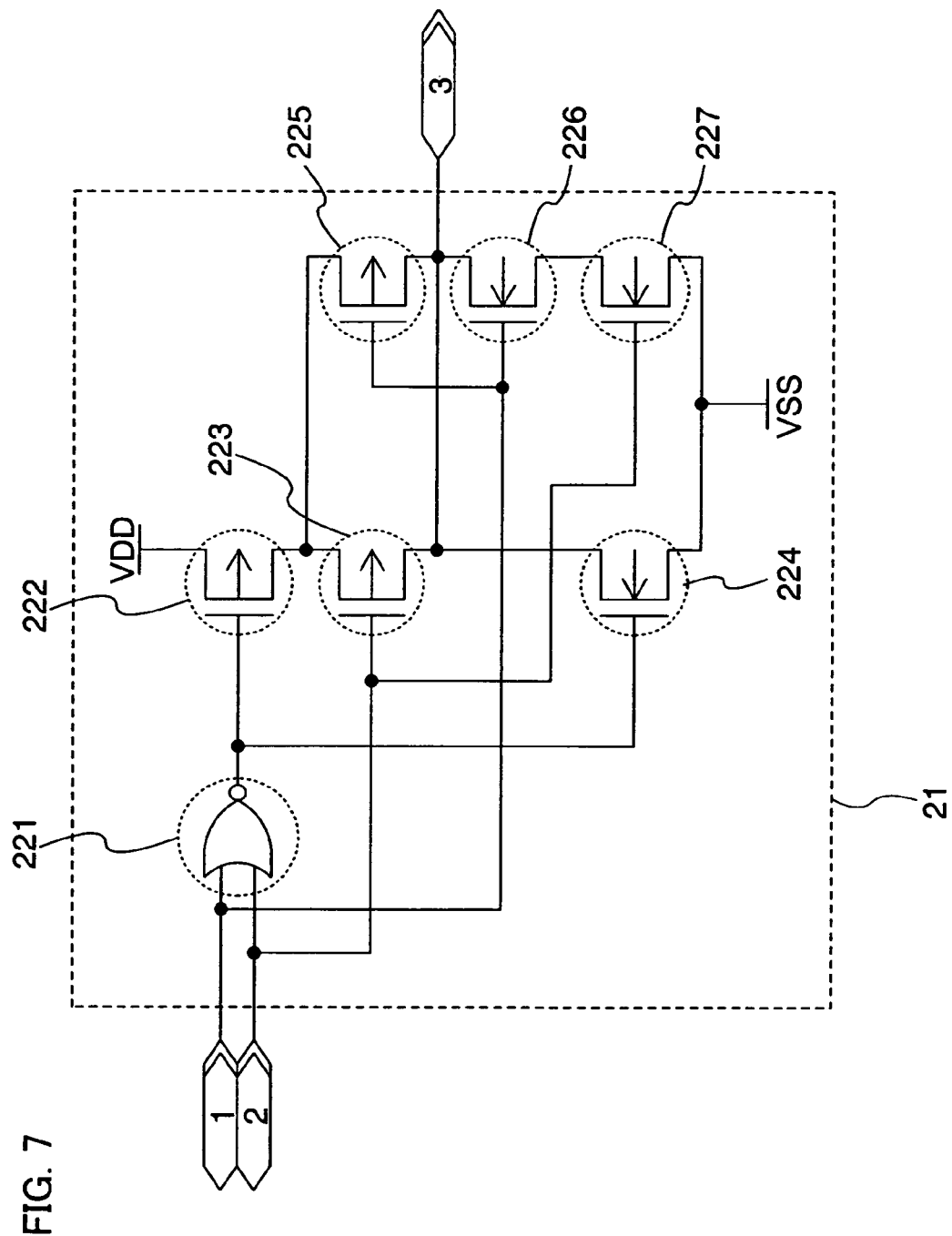
FIG. 7 is a diagram showing a structure of a semiconductor device of the invention.

A structure of the unit circuit 21 included in the phase comparator 11 is described below with reference to FIG. 7. The unit circuit 21 includes a NOR circuit 221, and transistors 222 to 227. The unit circuit 21 also includes two input terminals (denoted by 1 and 2 in the drawing) and one output terminal (denoted by 3 in the drawing).

When the same signal is inputted to each of the input terminal 1 and the input terminal 2, the unit circuit 21 outputs an H-level signal from the output terminal 3.

Meanwhile, when different signals are inputted to the input terminal 1 and the input terminal 2, the unit circuit 21 outputs an L-level signal from the output terminal 3.

That is to say, the unit circuit 21 compares the phase of a signal inputted to the input terminal 1 and that of a signal inputted to the input terminal 2, and outputs a signal from the output terminal 3 based on the comparison result. Note that the structure of the unit circuit 21 is not limited to this, and other known structures may be employed as well.

Figure 8:
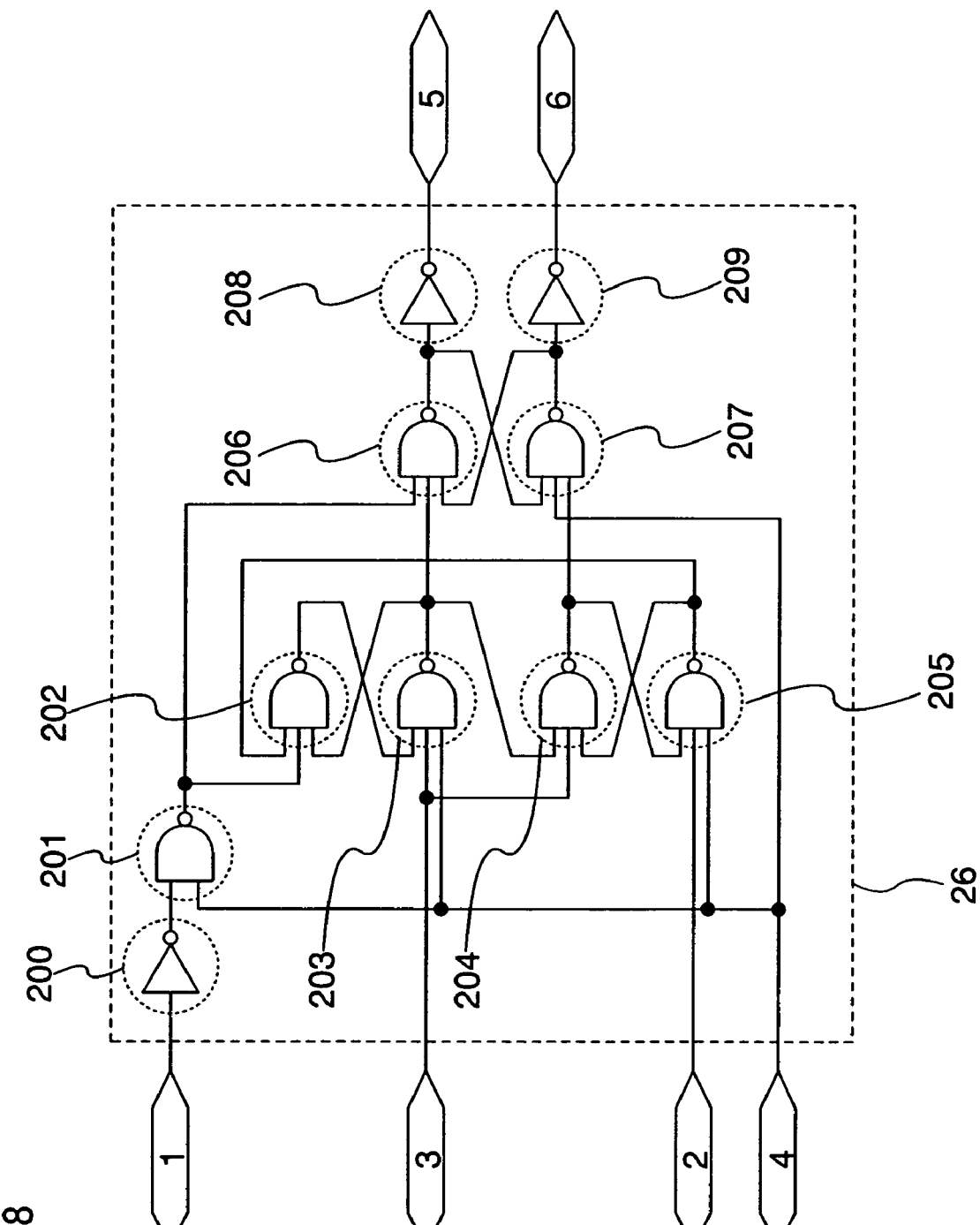
FIG. 8 is a diagram showing a structure of a semiconductor device of the invention.

A structure of a unit circuit 26 included in the divider 14 is described with reference to FIG. 8. The unit circuit 26 includes an inverter circuit 200, NAND circuits 201 to 207, and inverter circuits 208 and 209. The unit circuit 26 also includes four input terminals (denoted by 1, 2, 3, and 4 in the drawing) and two output terminals (denoted by 5 and 6 in the drawing).

The unit circuit 26 includes three latches: a latch constituted by the NAND circuits 202 and 203, a latch constituted by the NAND circuits 204 and 205, and a latch constituted by the NAND circuits 206 and 207. When a set signal is inputted from the input terminal 1, a data signal is inputted from the input terminal 2, a clock signal is inputted from the input terminal 3, and a reset signal is inputted from the input terminal 4, then a data signal is outputted from the output terminal 5 and a data signal is outputted from the output terminal 6. Although the aforementioned structure shows a set/reset type D flip-flop circuit, the invention is not limited to this and a JK flip-flop circuit or a T flip-flop circuit may be used as well.

A flip-flop (also referred to as a flip-flop circuit as described above) includes an RS flip-flop, a D flip-flop, a JK flip-flop, a T flip-flop and the like. The RS flip-flop includes an R terminal and an S terminal that are input terminals, and a Q terminal that is an output terminal. The D flip-flop includes a D terminal that is an input terminal and a Q terminal that is an output terminal. The JK flip-flop includes a J terminal and a K terminal that are input terminals, and a Q terminal that is an output terminal. The T flip-flop includes a T terminal that is an input terminal and a Q terminal that is an output terminal.

Embodiment 2

A manufacturing method of a semiconductor device of the invention is described with reference to drawings. Described below is a structure of a semiconductor device that includes a memory element and an antenna as well as thin film transistors constituting a voltage controlled oscillator.

Figure 9A:
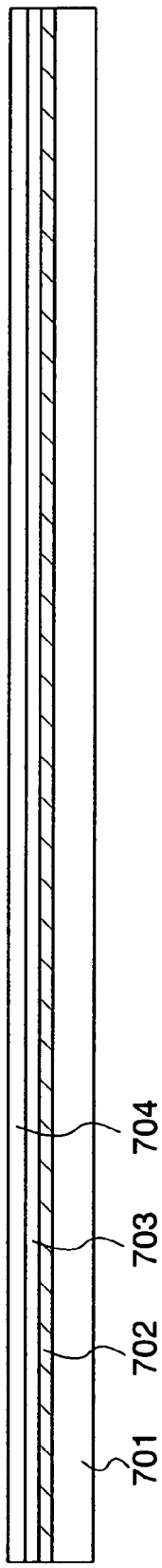
FIGS. 9A to 9C are diagrams each showing a manufacturing step of a semiconductor device of the invention.

A separation layer 702 is formed over a surface of a substrate 701 (also called a base) (see FIG. 9A). The substrate 701 has an insulating surface and is formed of glass or plastic. If the substrate 701 is formed of glass, it is not particularly limited in area and shape. Accordingly, when, for example, a rectangular substrate with a side of one meter or more is used as the substrate 701, productivity can be significantly improved. This is a major advantage as compared to the case of using a circular single crystal silicon substrate. If the substrate 701 is formed of plastic, it can be processed into a good design and flexible shape as it is thin and lightweight and can be bent. In addition, a plastic substrate has high impact resistance and can be easily attached to and incorporated in various products, leading to applications in various fields. When the substrate 701 is formed of plastic, it is necessary to use heat resistant plastic that is resistant to processing temperatures in manufacturing steps. As described below, it is preferable to form a thin film transistor over the substrate 701 formed of glass, separate the thin film transistor, and provide the separated thin film transistor over a plastic substrate.

Although the separation layer 702 is formed over the entire surface of the substrate 701 in the aforementioned step, the separation layer 702 formed over the entire surface of the substrate 701 may be patterned by photolithography to be selectively provided, if necessary. Further, although the separation layer 702 is formed in contact with the substrate 701, an insulating layer may be formed as a base in contact with the substrate 701 as needed, and the separation layer 702 may be formed in contact with the insulating layer.

In order to obtain the separation layer 702, a single layer or stacked layers are formed by a known method (sputtering, plasma CVD or the like) using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material mainly containing such elements. The layer containing silicon may have any of an amorphous structure, a microcrystalline structure, and a polycrystalline structure.

An insulating layer 703 is formed as a base covering the separation layer 702. In order to obtain the insulating layer 703, a single layer or stacked layers are formed by a known method (sputtering, plasma CVD or the like) using an oxide of silicon or a nitride of silicon. The oxide material of silicon is a substance containing silicon (Si) and oxygen (O), which corresponds to silicon oxide, silicon oxynitride, silicon nitride oxide and the like. The nitride material of silicon is a substance containing silicon and nitrogen (N), which corresponds to silicon nitride, silicon oxynitride, silicon nitride oxide and the like. The insulating layer 703 that is a base functions as a blocking film to prevent impurities from entering from the substrate 701.

Figure 9B:
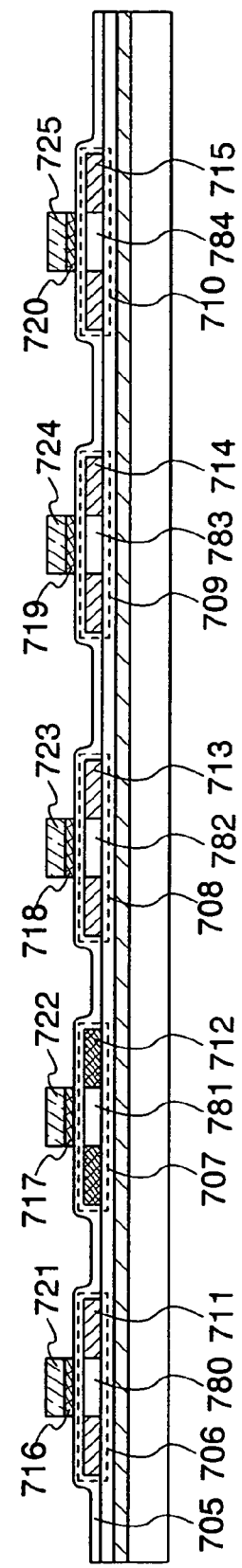

An amorphous semiconductor layer 704 is formed over the insulating layer 703. The amorphous semiconductor layer 704 is formed by a known method (sputtering, LPCVD, plasma CVD or the like). Subsequently, the amorphous semiconductor layer 704 is crystallized by a known crystallizing method (laser crystallization, thermal crystallization using RTA or an annealing furnace, thermal crystallization using a metal element that accelerates crystallization, laser crystallization combined with thermal crystallization using a metal element that accelerates crystallization, or the like). The obtained crystalline semiconductor layer is patterned into a desired shape, thereby forming crystalline semiconductor layers 706 to 710 (see FIG. 9B).

An example of manufacturing steps of the crystalline semiconductor layers 706 to 710 is described below. First, an amorphous semiconductor layer is formed by plasma CVD. After a solution containing nickel that is a metal element for accelerating crystallization is retained on the surface of the amorphous semiconductor layer, the amorphous semiconductor layer is subjected to dehydrogenation treatment (500° C., one hour) and thermal crystallization (550° C., four hours), thereby forming a crystalline semiconductor layer. Then, the crystalline semiconductor layer is irradiated with laser light as needed, and patterned by photolithography to form the crystalline semiconductor layers 706 to 710. If the crystalline semiconductor layers 706 to 710 are formed by laser crystallization, a continuous wave gas or solid-state laser, or a pulsed gas or solid-state laser is used.

When the amorphous semiconductor layer is crystallized using a metal element that accelerates crystallization, crystallization can be performed at a low temperature in a short time and crystals can be aligned in the same direction. On the other hand, off-current increases since the metal element remains in the crystalline semiconductor layers, leading to variations in characteristics. Accordingly, an amorphous semiconductor layer functioning as a gettering site is preferably formed over the crystalline semiconductor layers. The amorphous semiconductor layer functioning as a gettering site is required to contain an impurity element such as phosphorus and argon; therefore, it is preferably formed by sputtering so as to contain argon at a high concentration. Then, a metal element is diffused in the amorphous semiconductor layer by heat treatment (such as thermal annealing using RTA or an annealing furnace), and the amorphous semiconductor layer containing the metal element is removed. As a result, the metal element in the crystalline semiconductor layers can be reduced or removed.

Subsequently, a gate insulating layer 705 is formed to cover the crystalline semiconductor layers 706 to 710. In order to obtain the gate insulating layer 705, a single layer or stacked layers are formed by a known method (plasma CVD, sputtering or the like) using a layer containing an oxide of silicon or a nitride of silicon. Specifically, a single layer or stacked layers are formed using a layer containing silicon oxide, a layer containing silicon oxynitride, or a layer containing silicon nitride oxide.

A first conductive layer and a second conductive layer are stacked over the gate insulating layer 705. The first conductive layer is formed by a known method (plasma CVD, sputtering or the like) to have a thickness of 20 to 100 nm. The second conductive layer is formed by a known method to have a thickness of 100 to 400 nm.

The first conductive layer and the second conductive layer are formed of an element selected from tantalum (Ta), tungsten (W), titanium (Ti), molybdenum (Mo), aluminum (Al), copper (Cu), chromium (Cr), and niobium (Nb), or an alloy material or a compound material that mainly contains these elements. Instead, the first conductive layer and the second conductive layer are formed of a semiconductor material typified by polycrystalline silicon doped with an impurity element such as phosphorus.

The first conductive layer and the second conductive layer may be formed of, for example, a tantalum nitride (TaN, the composition ratio between tantalum (Ta) and nitrogen (N) is not limited) layer and a tungsten (W) layer, a tungsten nitride (WN, the composition ratio between tungsten (W) and nitrogen (N) is not limited) layer and a tungsten layer, a molybdenum nitride (MoN, the composition ratio between molybdenum (Mo) and nitrogen (N) is not limited) layer and a molybdenum (Mo) layer, or the like. If the first conductive layer and the second conductive layer are formed of tungsten or tantalum nitride that has high heat resistance, they may be subjected to heat treatment for thermal activation. If a three-layer structure is adopted instead of the two-layer structure, a molybdenum layer, an aluminum layer and a molybdenum layer may be stacked.

A resist mask is formed by photolithography, and conductive layers (also referred to as gate electrode layers) 716 to 725 functioning as gate electrodes are formed by etching for forming gate electrodes and gate wires.

A resist mask is formed by photolithography, and a low concentration of an impurity element that imparts N-type conductivity is added to the crystalline semiconductor layers 706 and 708 to 710 by ion doping or ion implantation, thereby forming N-type impurity regions 711 and 713 to 715 and channel forming regions 780 and 782 to 784. The impurity element that imparts N-type conductivity may be an element belonging to group 15 of the periodic table, and for example, phosphorous (P) or arsenic (As) may be used.

A resist mask is formed by photolithography, and an impurity element that imparts P-type conductivity is added to the crystalline semiconductor layer 707, thereby forming a P-type impurity region 712 and a channel forming region 781. As the impurity element that imparts P-type conductivity, for example, boron (B) is used.

Figure 9C:
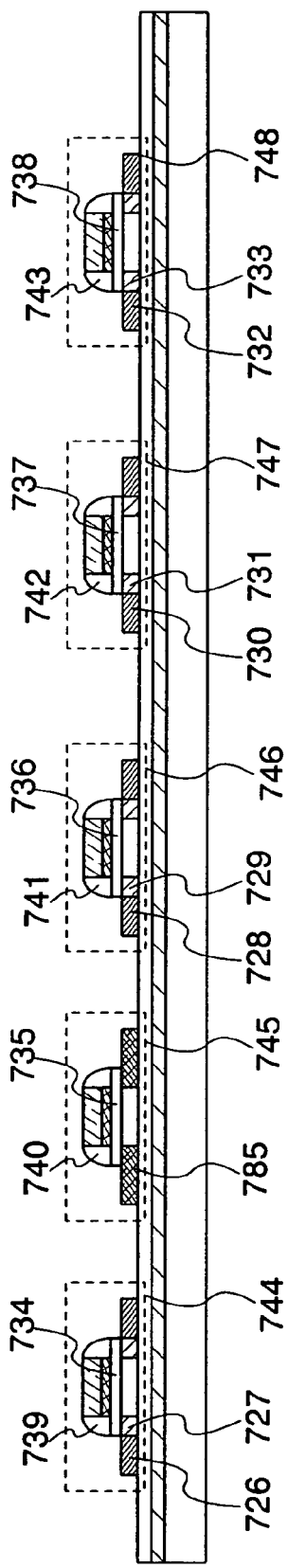

An insulating layer is formed to cover the gate insulating layer 705 and the conductive layers 716 to 725. In order to obtain the insulating layer, a single layer or stacked layers are formed by a known method (plasma CVD, sputtering or the like) using a layer containing an inorganic material such as silicon, an oxide of silicon and a nitride of silicon, or a layer containing an organic material such as an organic resin. Then, the insulating layer is selectively etched by anisotropic etching that is mainly in the direction perpendicular to the surface of the substrate, so that insulating layers (also called sidewalls) 739 to 743 are formed in contact with the sides of the conductive layers 716 to 725 (see FIG. 9C). While forming the insulating layers 739 to 743, insulating layers 734 to 738 are formed by etching the insulating layer 705. The insulating layers 739 to 743 are used as masks in a subsequent doping step for forming LDD (Lightly Doped Drain) regions.

An impurity element that imparts N-type conductivity is added to the crystalline semiconductor layers 706 and 708 to 710 using as masks a resist mask formed by photolithography and the insulating layers 739 to 743, thereby forming first N-type impurity regions (also called LDD regions) 727, 729, 731, and 733 and second N-type impurity regions 726, 728, 730, and 732. The concentration of the impurity element contained in the first N-type impurity regions 727, 729, 731, and 733 is lower than that in the second N-type impurity regions 726, 728, 730, and 732. Through the aforementioned steps, N-type thin film transistors 744 and 746 to 748 and a P-type thin film transistor 745 are completed.

An LDD region is formed by either of the following two methods: a gate electrode having a two or more layer stacked structure is etched or anisotropically etched and a lower layer conductive layer of the gate electrode is used as a mask; or a sidewall insulating layer is used as a mask. When adopting the latter method where a sidewall insulating layer is used as a mask, the width of the LDD region is controlled easily and the LDD region is surely formed.

Subsequently, an insulating layer is formed of a single layer or stacked layers so as to cover the thin film transistors 744 to 748 (see FIG. 10A). In order to obtain the insulating layer covering the thin film transistors 744 to 748, a single layer or stacked layers are formed by a known method (SOG, droplet discharging or the like) using an inorganic material such as an oxide of silicon and a nitride of silicon, an organic material such as polyimide, polyamide, benzocyclobutene, acrylic, epoxy, and siloxane, or the like. Siloxane corresponds to a resin including Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be used as the substituent. Further alternatively, a fluoro group and an organic group containing at least hydrogen may be used as the substituent.

If the insulating layer covering the thin film transistors 744 to 748 has, for example, a three-layer structure, a layer containing silicon oxide may be formed as a first insulating layer 749, a layer containing a resin may be formed as a second layer insulating layer 750, and a layer containing silicon nitride may be formed as a third layer insulating layer 751.

Before forming the insulating layers 749 to 751 or after forming one or more of the insulating layers 749 to 751, heat treatment may be performed for recovery of the crystallinity of the semiconductor layers, activation of the impurity elements added to the semiconductor layers, and hydrogenation of the semiconductor layers. As the heat treatment, thermal annealing, laser annealing, RTA or the like may be adopted.

Next, the insulating layers 749 to 751 are etched by photolithography, thereby forming openings to expose the second N-type impurity regions 726, 728, 730, and 732 and the P-type impurity region 785. Then, conductive layers are formed to fill in the openings, and patterned to form conductive layers 752 to 761 functioning as source wires or drain wires.

In order to obtain the conductive layers 752 to 761, a single layer or stacked layers are formed by a known method (plasma CVD, sputtering or the like) using an element selected from titanium (Ti), aluminum (Al) and neodymium (Nd), or an alloy material or a compound material mainly containing such elements. The alloy material mainly containing aluminum corresponds, for example, to a material that mainly contains aluminum and contains nickel, or an alloy material that mainly contains aluminum and contains nickel and one or both of carbon and silicon. The conductive layers 752 to 761 may adopt, for example, a stacked layer structure of a barrier layer, an aluminum-silicon (Al—Si) layer and a barrier layer, or a stacked layer structure of a barrier layer, an aluminum-silicon (Al—Si) layer, a titanium nitride (TiN, the composition ratio between titanium (Ti) and nitrogen (N) is not limited) layer, and a barrier layer. Here, aluminum silicon contains about 0.1 to 5 wt % of silicon. In addition, the barrier layer corresponds to a thin film made of titanium, a nitride of titanium, molybdenum, or a nitride of molybdenum. Aluminum and aluminum silicon are suitable for the material of the conductive layers 752 to 761 since they have a low resistance value and are inexpensive. If barrier layers are provided as the top and bottom layers, hillock generation of aluminum or aluminum silicon can be prevented. In addition, if the barrier layer is formed of titanium that has high reducing ability, a thin natural oxide layer which may possibly be formed over the crystalline semiconductor layers can be reduced, and the barrier layer and the crystalline semiconductor layers can be connected appropriately.

Subsequently, an insulating layer 762 is formed to cover the conductive layers 752 to 761 (see FIG. 10B). In order to obtain the insulating layer 762, a single layer or stacked layers are formed by a known method (SOG, droplet discharging or the like) using an inorganic material or an organic material. The insulating layer 762 is preferably formed to have a thickness of 0.75 to 3 μm.

The insulating layer 762 is etched by photolithography, thereby forming openings to expose the conductive layers 757, 759 and 761. Then, a conductive layer is formed to fill in the openings. The conductive layer is formed by a known method (plasma CVD, sputtering or the like) using a conductive material. Subsequently, the conductive layer is patterned to form conductive layers 763 to 765.

Each of the conductive layers 763 to 765 corresponds to one of a pair of conductive layers included in a memory element. Accordingly, it is preferable that each of the conductive layers 763 to 765 be formed of a single layer or stacked layers using titanium, or an alloy material or a compound material that mainly contains titanium. Since titanium has a low resistance value, the size of the memory element can be reduced, leading to high integration. In addition, in a photolithography step for forming the conductive layers 763 to 765, wet etching is preferably performed in order not to damage the thin film transistors 744 to 748 on the bottom layer, and hydrogen fluoride or ammonia peroxide mixture may be used as an etchant.

An insulating layer 766 is formed to cover the conductive layers 763 to 765. In order to obtain the insulating layer 766, a single layer or stacked layers are formed by a known method (SOG, droplet discharging or the like) using an inorganic material or an organic material. The insulating layer 766 is preferably formed to have a thickness of 0.75 to 3 □m. Then, the insulating layer 766 is etched by photolithography, thereby forming openings 767 to 769 to expose the conductive layers 763 to 765.

Figure 11A:
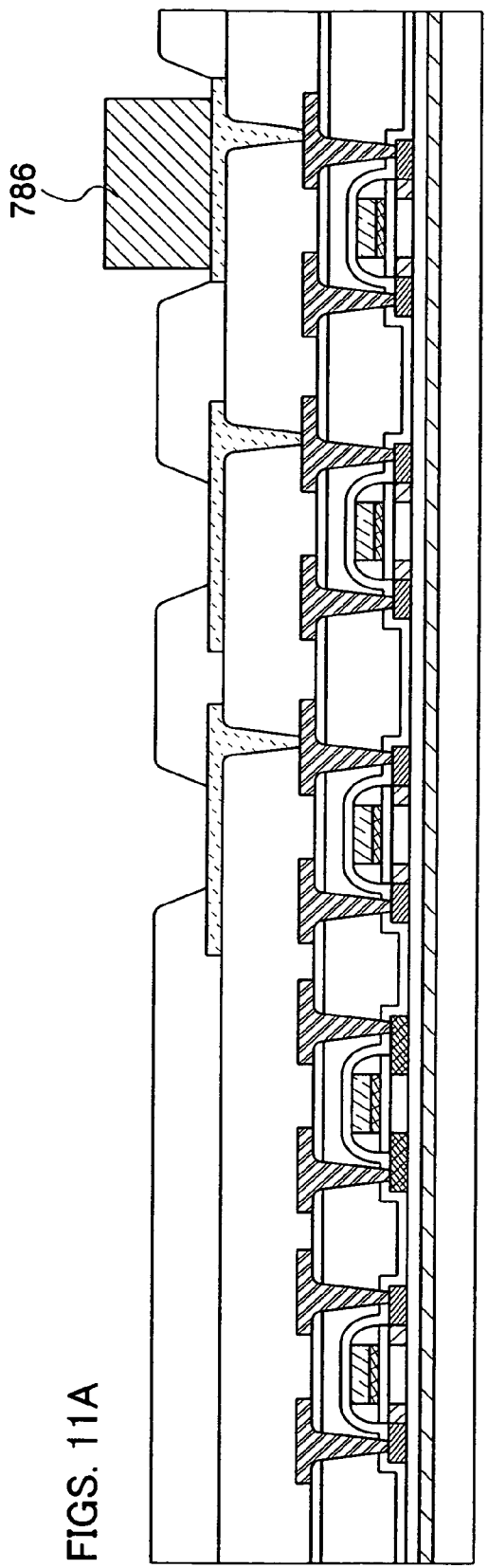
FIGS. 11A and 11B are diagrams each showing a manufacturing step of a semiconductor device of the invention.

A conductive layer 786 functioning as an antenna is formed in contact with the conductive layer 765 (see FIG. 11A). The conductive layer 786 is formed by a known method (plasma CVD, sputtering, printing, droplet discharging or the like) using a conductive material. The conductive layer 786 is preferably formed of a single layer or stacked layers using an element selected from aluminum (Al), titanium (Ti), silver (Ag), and copper (Cu), or an alloy material or a compound material that mainly contains these elements.

Specifically, the conductive layer 786 is formed by screen printing using a paste containing silver and then applying heat treatment at a temperature of 50 to 350° C. Alternatively, the conductive layer 786 may be obtained by forming an aluminum layer by sputtering and then patterning the aluminum layer. The aluminum layer is preferably patterned by wet etching, and then subjected to heat treatment at a temperature of 200 to 300° C.

Figure 11B:
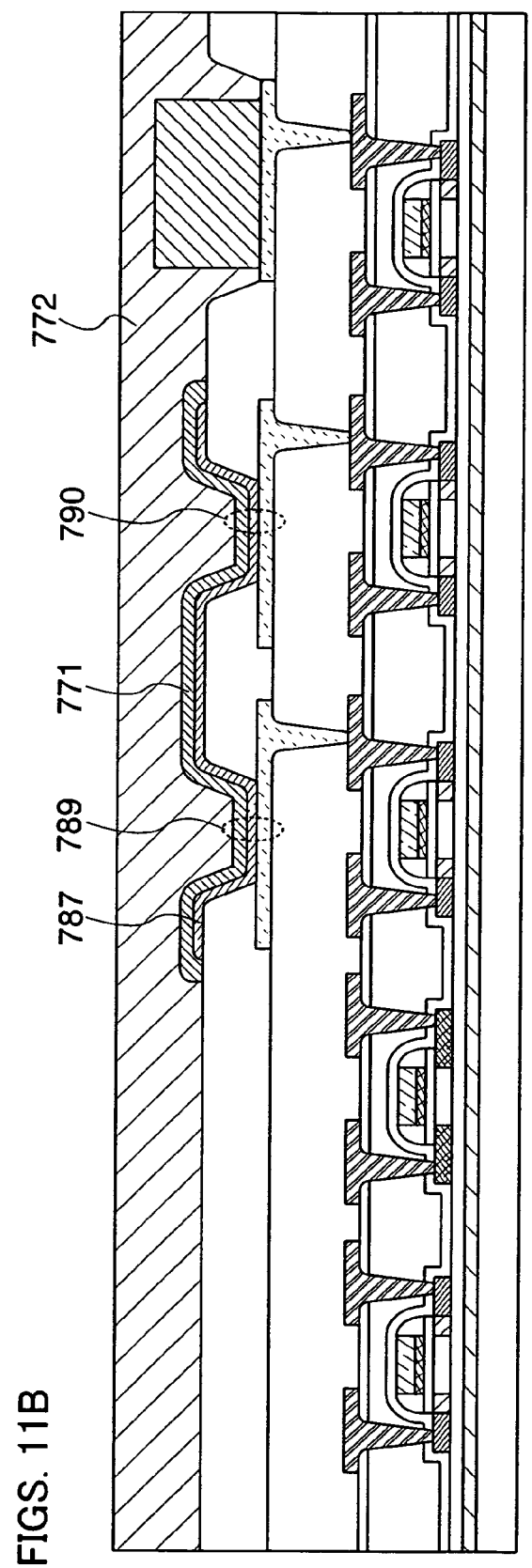

Subsequently, a layer 787 containing an organic compound is formed in contact with the conductive layers 763 and 764 (see FIG. 11B). The layer 787 containing an organic compound is formed by a known method (droplet discharging, vapor deposition or the like). Then, a conductive layer 771 is formed in contact with the layer 787 containing an organic compound. The conductive layer 771 is formed by a known method (sputtering, vapor deposition or the like).

Through the aforementioned steps, a memory element 789 formed by stacking the conductive layer 763, the layer 787 containing an organic compound, and the conductive layer 771, and a memory element 790 formed by stacking the conductive layer 764, the layer 787 containing an organic compound, and the conductive layer 771 are completed.

In the aforementioned manufacturing steps, since the layer 787 containing an organic compound does not have high heat resistance, the step of forming the layer 787 containing an organic compound is performed after the step of forming the conductive layer 786 functioning as an antenna.

Subsequently, an insulating layer 772 functioning as a protective layer is formed by a known method (SOG, droplet discharging or the like) so as to cover the memory elements 789 and 790 and the conductive layer 786 functioning as an antenna. The insulating layer 772 is formed of a layer containing carbon such as DLC (Diamond Like Carbon), a layer containing silicon nitride, a layer containing silicon nitride oxide, or an organic material, and preferably formed of an epoxy resin.

The insulating layers 703, 749, 750, 751, 762, and 766 are etched by photolithography so as to expose the separation layer 702, thereby forming openings 773 and 774 (see FIG. 12A).

Then, an etchant is put in the openings 773 and 774 to remove the separation layer 702 (see FIG. 12B). A gas or liquid containing halogen fluoride or an inter-halogen compound is used as the etchant. For example, chlorine trifluoride (ClF3), nitrogen trifluoride (NF3), bromine trifluoride (BrF3), or hydrogen fluoride (HF) is used as the etchant. It is to be noted that if hydrogen fluoride is used as the etchant, the separation layer 702 is formed of silicon oxide.

Through the aforementioned steps, a thin film integrated circuit 791 is separated from the substrate 701. The thin film integrated circuit 791 refers to the thin film transistors 744 to 748, an element group of the memory elements 789 and 790, and the conductive layer 786 functioning as an antenna. In other words, the plurality of elements that are separated from the substrate as described above are called a thin film integrated circuit in some cases.

The substrate 701 separated from the thin film integrated circuit 791 is preferably reused for cost reduction. The insulating layer 772 is formed to prevent the thin film integrated circuit 791 from scattering after the separation layer 702 is removed. Since the thin film integrated circuit 791 is small, thin and lightweight, it easily scatters as it is not tightly attached to the substrate 701 after the separation layer 702 is removed. However, by forming the insulating layer 772 over the thin film integrated circuit 791, the weight of the thin film integrated circuit 791 can be increased and thus the scattering of the thin film integrated circuit 791 from the substrate 701 can be prevented. The thin film integrated circuit 791 itself is thin and lightweight; however, by forming the insulating layer 772, the thin film integrated circuit 791 is not rolled and can have a certain degree of strength.

Figure 13:
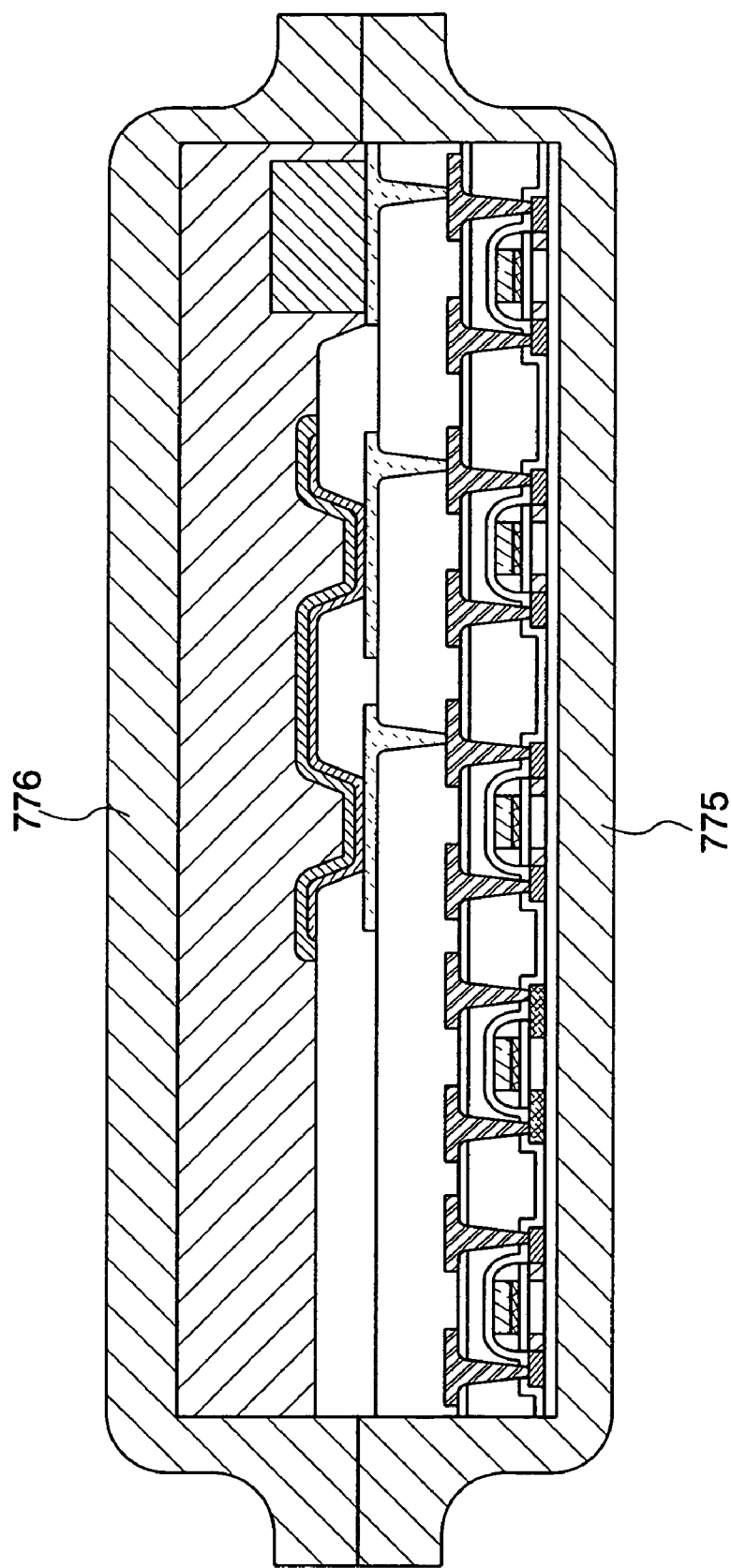
FIG. 13 is a diagram showing a manufacturing step of a semiconductor device of the invention.

Next, one surface of the thin film integrated circuit 791 is attached to a first substrate 776 and completely separated from the substrate 701 (see FIG. 13). Then, the other surface of the thin film integrated circuit 791 is attached to a second substrate 775, and the thin film integrated circuit 791 is sealed with the first substrate 776 and the second substrate 775 by applying one or both of heat treatment and pressure treatment.

Each of the first substrate 776 and the second substrate 775 corresponds to a film made of polypropylene, polyester, vinyl, polyvinyl fluoride, polyvinyl chloride or the like, paper of a fibrous material, a stacked film of a base film (polyester, polyamide, an inorganic vapor deposited film, paper, or the like) and an adhesive synthetic resin film (an acrylic-based synthetic resin, an epoxy-based synthetic resin, or the like), and the like. The film is attached to a subject by heat treatment and pressure treatment. In performing the heat treatment and the pressure treatment, an adhesive layer that is provided on the outermost surface of the film, or a layer (not an adhesive layer) that is provided on the outermost surface of the film and melted by heat treatment is attached by applying pressure.

Adhesive layers may be provided over the surface of the first substrate 776 and the second substrate 775, or not. Each adhesive layer corresponds to a layer containing an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, and an acrylic resin-based adhesive.

In the aforementioned structure, the memory elements 789 and 790 are each an element where a layer containing an organic compound is provided between a pair of conductive layers. Data is written to the memory elements 789 and 790 when the pair of conductive layers thereof are short circuited. Meanwhile, data is read from the memory elements 789 and 790 by reading a difference of a resistance value thereof. Such memory elements 789 and 790 are characterized in that they are non-volatile, data thereof cannot be rewritten, and data can be written thereto if data has not been written yet. Further, the memory elements 789 and 790 can be easily manufactured since each of them has a three-layer stacked structure. In addition, the three-layer stacked structure allows high integration to be achieved easily by reducing the area of the stacked portion.

Embodiment 3

A manufacturing method of a semiconductor device of the invention is described with reference to FIGS. 14A and 14B and FIG. 15.

Figure 14A:
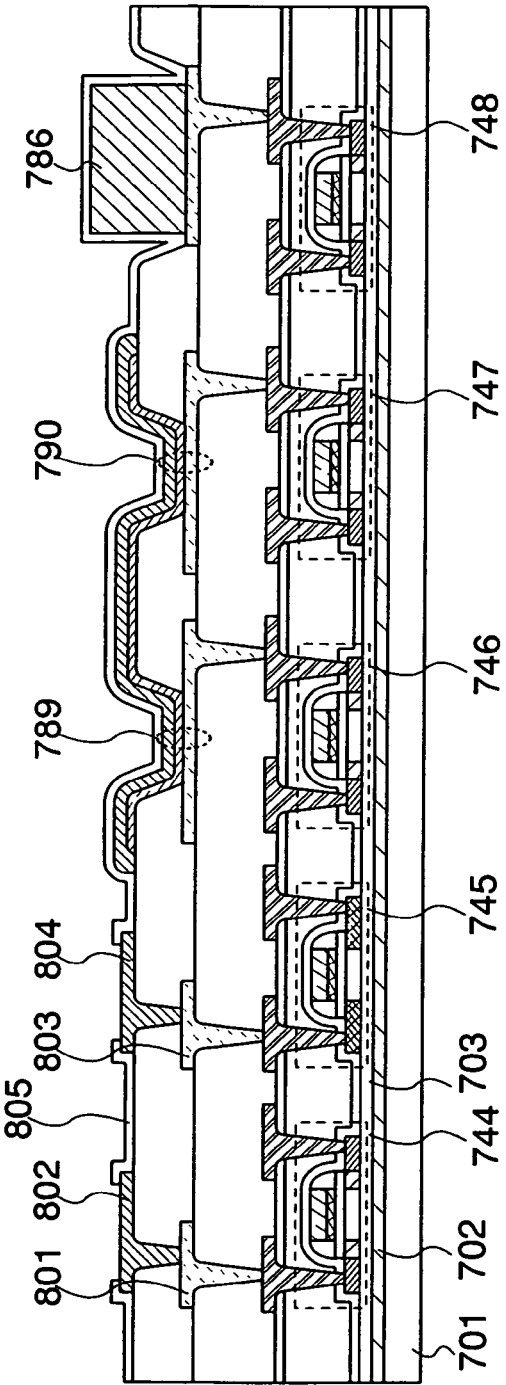
FIGS. 14A and 14B are diagrams each showing a manufacturing step of a semiconductor device of the invention.
Figure 15:
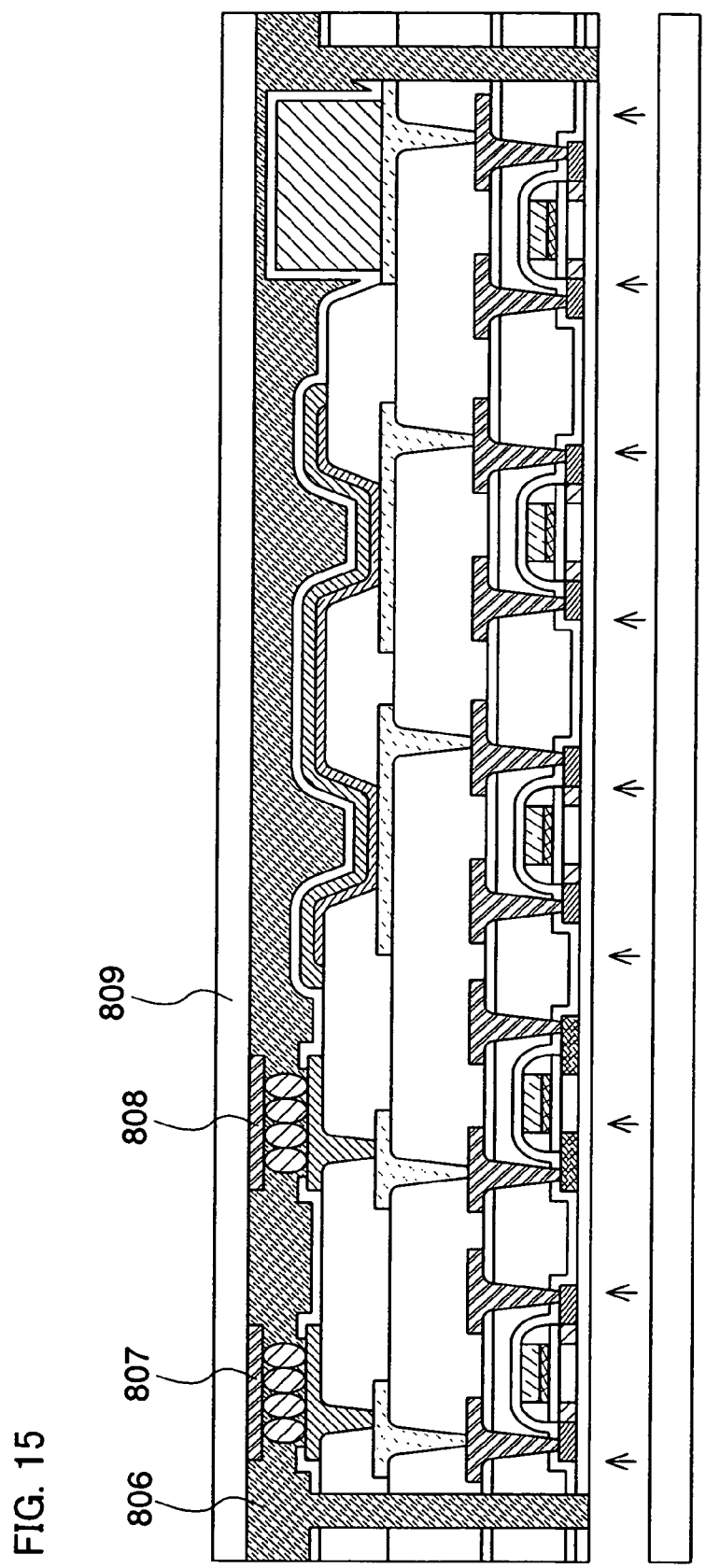
FIG. 15 is a diagram showing a manufacturing step of a semiconductor device of the invention.

The thin film transistors 744 to 748, the memory elements 789 and 790, and the conductive layer 786 functioning as an antenna are provided over the substrate 701 (see FIG. 14A). The steps for forming these elements are the same as the steps shown in FIGS. 9A to 11B, except in that conductive layers 801 and 802 electrically connected to a source or a drain of the thin film transistor 744, and conductive layers 803 and 804 electrically connected to a source or a drain of the thin film transistor 745 are additionally provided. Therefore, description thereof is omitted.

An insulating layer 805 is formed to cover the plurality of elements. Then, the insulating layer 805 is selectively removed so as to expose a part of the conductive layers 802 and 804.

Figure 14B:
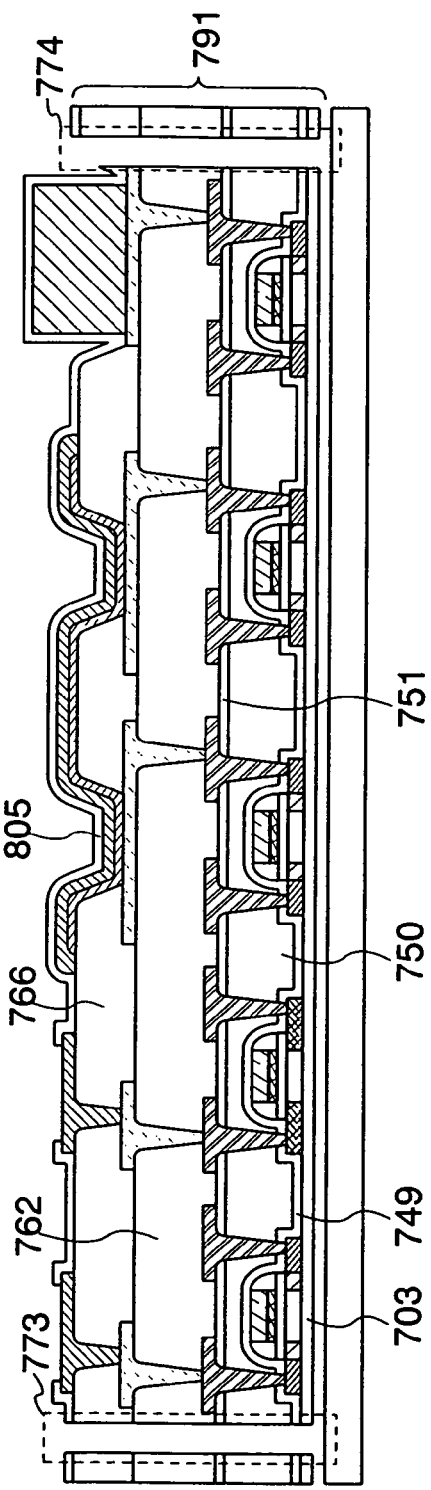

The insulating layers 703, 749, 750, 751, 762, 766, and 805 are etched by photolithography so as to expose the separation layer 702, thereby forming the openings 773 and 774 (see FIG. 14B). Subsequently, an etchant is put in the openings 773 and 774 to remove the separation layer 702.

With an anisotropic conductive paste 806, the thin film integrated circuit 791 is attached to a substrate 809 over which conductive layers 807 and 808 are formed. Then, the thin film integrated circuit 791 is separated from the substrate 701 (see FIG. 15).

It is to be noted that when the thin film integrated circuit 791 is attached to the substrate 809, the conductive layer 802 is electrically connected to the conductive layer 807, and the conductive layer 804 is electrically connected to the conductive layer 808. The substrate 809 includes, for example, a pixel portion for displaying images and other arithmetic circuits, and the conductive layers 807 and 808 are electrically connected to the pixel portion and the other arithmetic circuits.

Embodiment 4

A manufacturing method of a semiconductor device of the invention is described with reference to FIGS. 16A, 16B, 17A, and 17B.

The thin film transistors 744 to 748, the memory elements 789 and 790, and the conductive layer 786 functioning as an antenna are provided over the substrate 701. The steps for forming these elements are the same as the steps shown in FIGS. 9A to 11B, except in that conductive layers 821 and 822 are additionally provided; therefore, description thereof is omitted (see FIG. 16A). The conductive layer 821 is connected to the source or the drain of the thin film transistor 744, and is in contact with the substrate 701. The conductive layer 822 is connected to the source or the drain of the thin film transistor 745, and is in contact with the substrate 701.

The insulating layers 703, 749, 750, 751, 762, 766, and 772 are etched by photolithography so as to expose the separation layer 702, thereby forming the openings 773 and 774 (see FIG. 16B). Subsequently, an etchant is put in the openings 773 and 774 to remove the separation layer 702.

A substrate 825 is attached to one surface of the thin film integrated circuit 791, and the thin film integrated circuit 791 is separated from the substrate 701 (see FIG. 17A). Then, the other surface of the thin film integrated circuit 791 is attached to the substrate 809 including the conductive layers 807 and 808 with the anisotropic conductive paste 806 (see FIG. 17B). The substrate 809 includes, for example, a pixel portion for displaying images and other arithmetic circuits, and the conductive layers 807 and 808 are electrically connected to the pixel portion and the other arithmetic circuits.

Embodiment 5

An IC card and a panel each of which is one mode of the semiconductor device of the invention are described with reference to FIGS. 18A to 18D and FIGS. 19A and 19B.

Figure 18A:
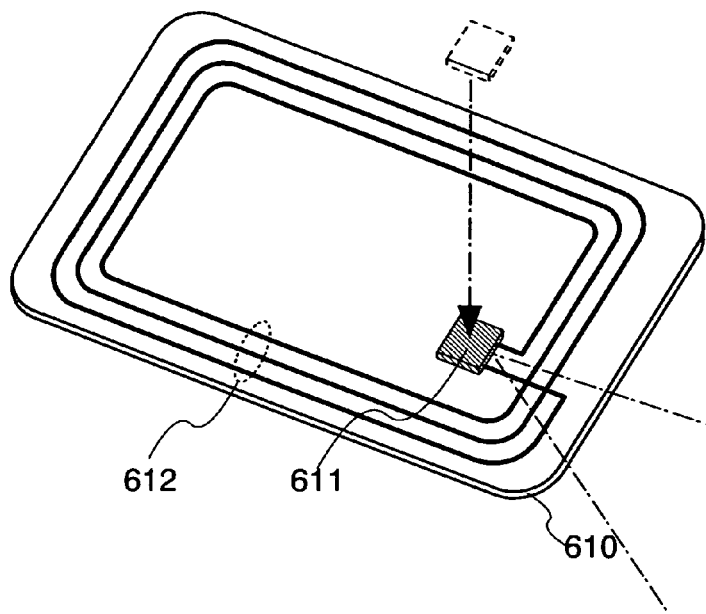
FIGS. 18A to 18D are diagrams each showing a structure of a semiconductor device of the invention.
Figure 18C:
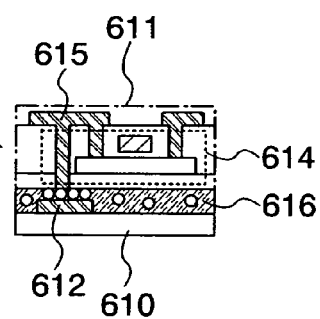
Figure 18B:
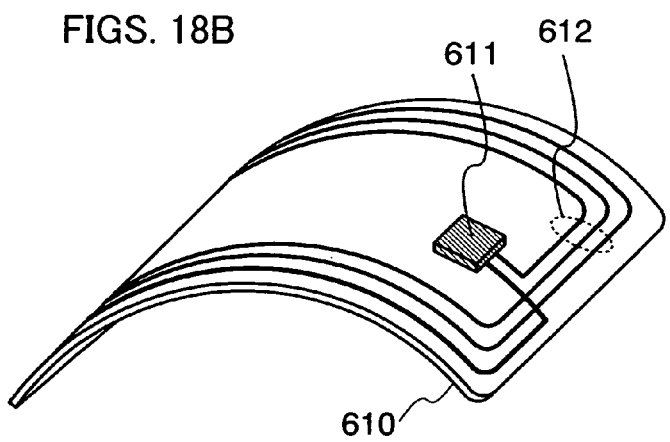
Figure 18D:
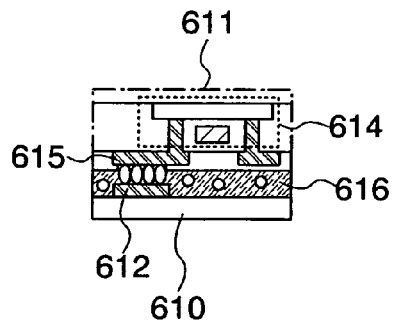

First, an IC card is described (see FIG. 18A). In the IC card, a thin film integrated circuit 611 is attached to a substrate 610 over which a conductive layer 612 functioning as an antenna is provided. The conductive layer 612 over the substrate 610 and a conductive layer 615 that is connected to a thin film transistor 614 constituting the thin film integrated circuit 611 are electrically connected to each other with an anisotropic conductive paste 616 (see FIGS. 18C and 18D). The substrate 610 is preferably formed of plastic. According to this, the substrate 610 can be easily processed into a good design and flexible shape as it is thin and lightweight and can be bent (see FIG. 18B). In addition, an IC card having high impact resistance can be provided.

The thin film integrated circuit 611 may include one or more of an arithmetic circuit, a memory circuit, a power supply circuit, a demodulation circuit, and a modulation circuit as well as the PLL circuit described in the aforementioned embodiment mode.

The IC card transmits or receives electromagnetic waves to or from a reader/writer through the conductive layer 612 functioning as an antenna. Such an operation of transmitting or receiving electromagnetic waves is briefly described below.

When a reader/writer transmits electromagnetic waves, the electromagnetic waves are converted into an AC electrical signal in the conductive layer 612 functioning as an antenna. A power supply circuit generates a power supply voltage using the AC electrical signal, and supplies the power supply voltage to each circuit. A demodulation circuit demodulates an AC electrical signal, and supplies the demodulated signal to an arithmetic circuit. The arithmetic circuit performs various operations based on an inputted signal, and outputs a control signal to a memory circuit and the like. A modulation circuit modulates load on the conductive layer 612 functioning as an antenna based on a signal supplied from the arithmetic circuit. The reader/writer receives as electromagnetic waves the modulated load on the antenna. In this manner, the IC card receives electromagnetic waves from the reader/writer and generates a power supply voltage based on the received electromagnetic waves.

Figure 19A:
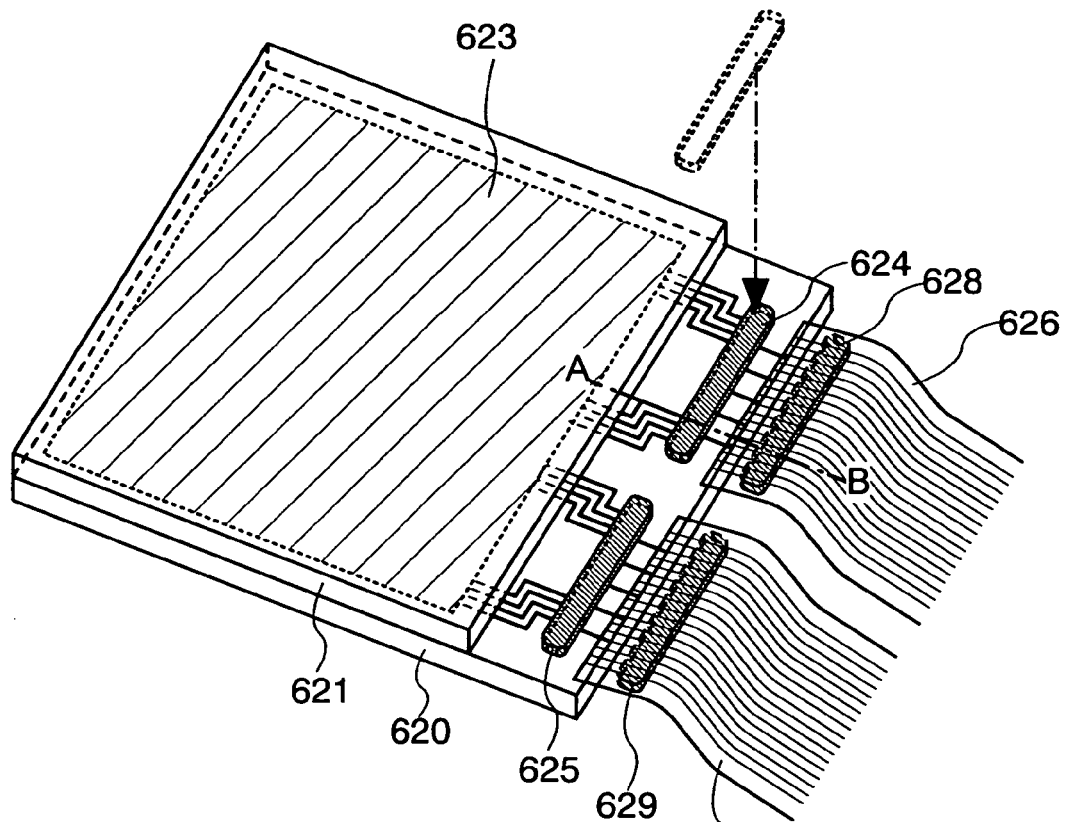
FIGS. 19A and 19B are diagrams each showing a structure of a semiconductor device of the invention.
Figure 19B:
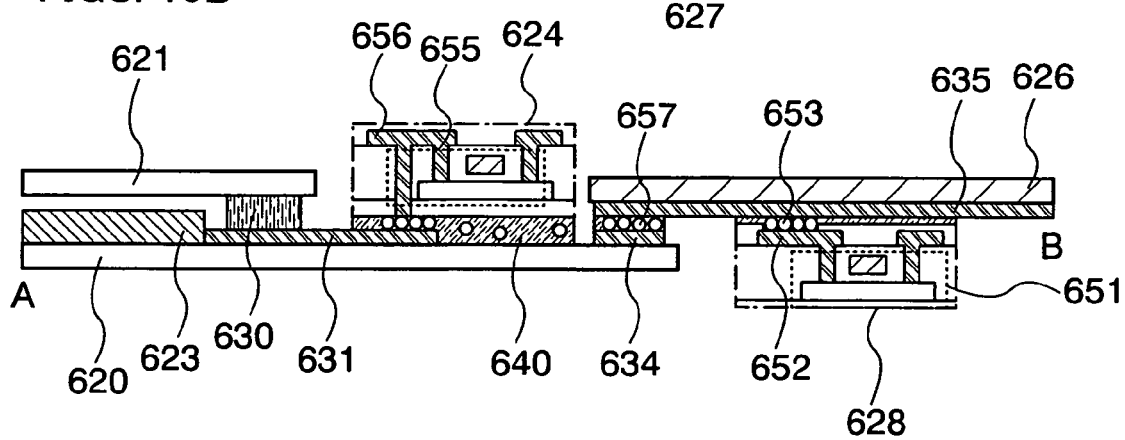

Next, a panel is described (see FIGS. 19A and 19B). In the panel, thin film integrated circuits 624 and 625 of the invention are attached onto a substrate 620 over which a pixel portion 623 having a function of displaying images is provided. In addition, thin film integrated circuits 628 and 629 are attached onto connecting films 626 and 627.

The substrate 620 is attached to a substrate 621 with a sealing member 630. The pixel portion 623 is electrically connected to the thin film integrated circuit 624. Specifically, a conductive layer 631 connected to the pixel portion 623 and a conductive layer 656 connected to a thin film transistor 655 included in the thin film integrated circuit 624 are electrically connected to each other with an anisotropic conductive paste 640.

In addition, various circuits over the substrate 620 are electrically connected to a conductive layer 635 of the connecting film 626. Specifically, a conductive layer 634 over the substrate 620 and the conductive layer 635 over the connecting film 626 are electrically connected to each other with an anisotropic conductive paste 657. Further, the conductive layer 635 of the connecting film 626 is electrically connected to the thin film integrated circuit 628. Specifically, the conductive layer 635 of the connecting film 626 and a conductive layer 652 connected to a thin film transistor 651 included in the thin film integrated circuit 628 are electrically connected to each other through an anisotropic conductive paste 653.

It is to be noted that the mode of the semiconductor device of the invention is not limited to the aforementioned IC card and panel. The semiconductor device of the invention may be applied to a CPU, various processors, and the like.

Embodiment 6

Figure 20A:
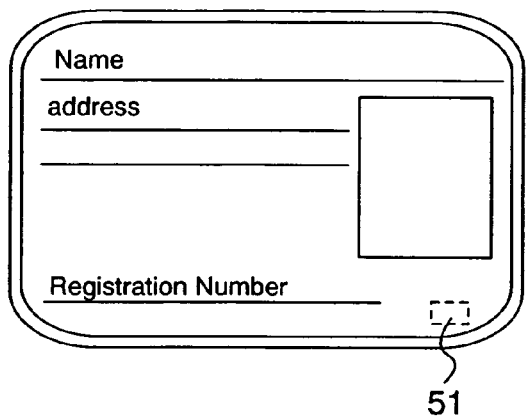
FIGS. 20A to 20E are diagrams each showing a structure of a semiconductor device of the invention.
Figure 20B:
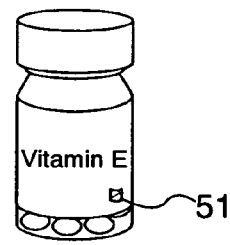
Figure 20C:
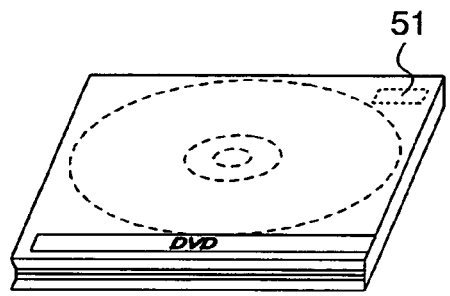
Figure 20D:
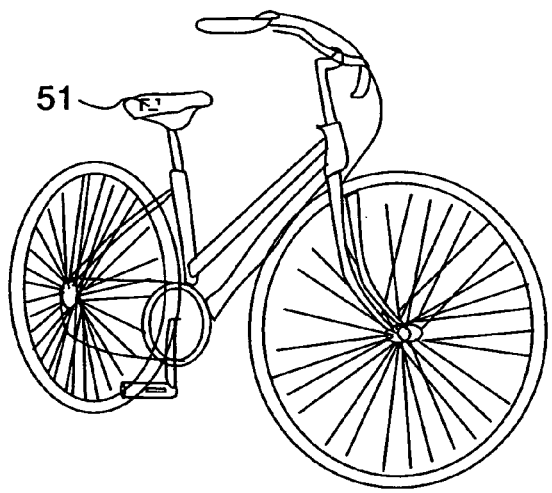
Figure 20E:
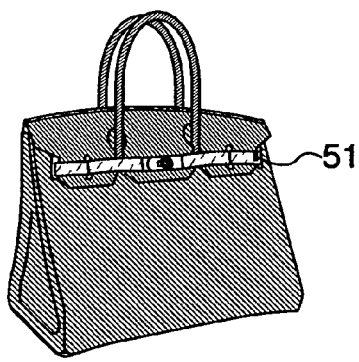

A semiconductor device of the invention, which includes an antenna provided over a substrate can transmit, receive, or transmit and receive electromagnetic waves using the antenna. Accordingly, the application range of a semiconductor device 51 is so wide that it can be incorporated in paper, coins, securities, bearer bonds, certificates (driving license, resident card or the like, see FIG. 20A), packaging containers (wrapping paper, bottles or the like, see FIG. 20B), recording media (DVD software, video tapes or the like, see FIG. 20C), vehicles (bicycle or the like, see FIG. 20D), accessories (bags, glasses or the like, see FIG. 20E), food items, clothes, livingware, electronic apparatuses, and the like. The electronic apparatuses include a liquid crystal display device, an EL display device, a television set (also called a TV, a TV receiver, or a television receiver), a portable terminal and the like.

A semiconductor device is fixed to a product by being attached to the surface thereof or incorporated therein. For example, a semiconductor device is incorporated in the paperboard of the cover of a book, or an organic resin of wrapping paper. A semiconductor device is also attached to the surface of or incorporated in, for example, bills, coins, securities, bearer bonds, or certificates. When a semiconductor device is mounted on packaging containers, recording media, personal belongings, food items, clothes, livingware, electronic apparatuses, and the like among the aforementioned products, inspection systems, rental systems and the like can be performed more efficiently.

When a semiconductor device is applied to product management or distribution system, high performance system can be achieved. For example, when a portable terminal including a display portion is provided with a reader/writer and a product is provided with a semiconductor device, a system is achieved where the display portion displays data on the product such as ingredients, a place of origin, and a record of the distribution process when the semiconductor device is put close to the reader/writer. As a result, a system with multifunction and high added value is achieved. As another example, a semiconductor device may be mounted on a product while a reader/writer may be provided beside a conveyor belt. In such a case, the product can be inspected easily and a system with multifunction can be achieved. This embodiment can be freely combined with other embodiment mode and embodiments.

Embodiment 7

A semiconductor device of the invention, where a pixel portion having a plurality of pixels is formed over a substrate can display images using the display portion. Accordingly, the semiconductor device is preferably applied to electronic apparatuses, and examples of them are described below.

Figure 21:
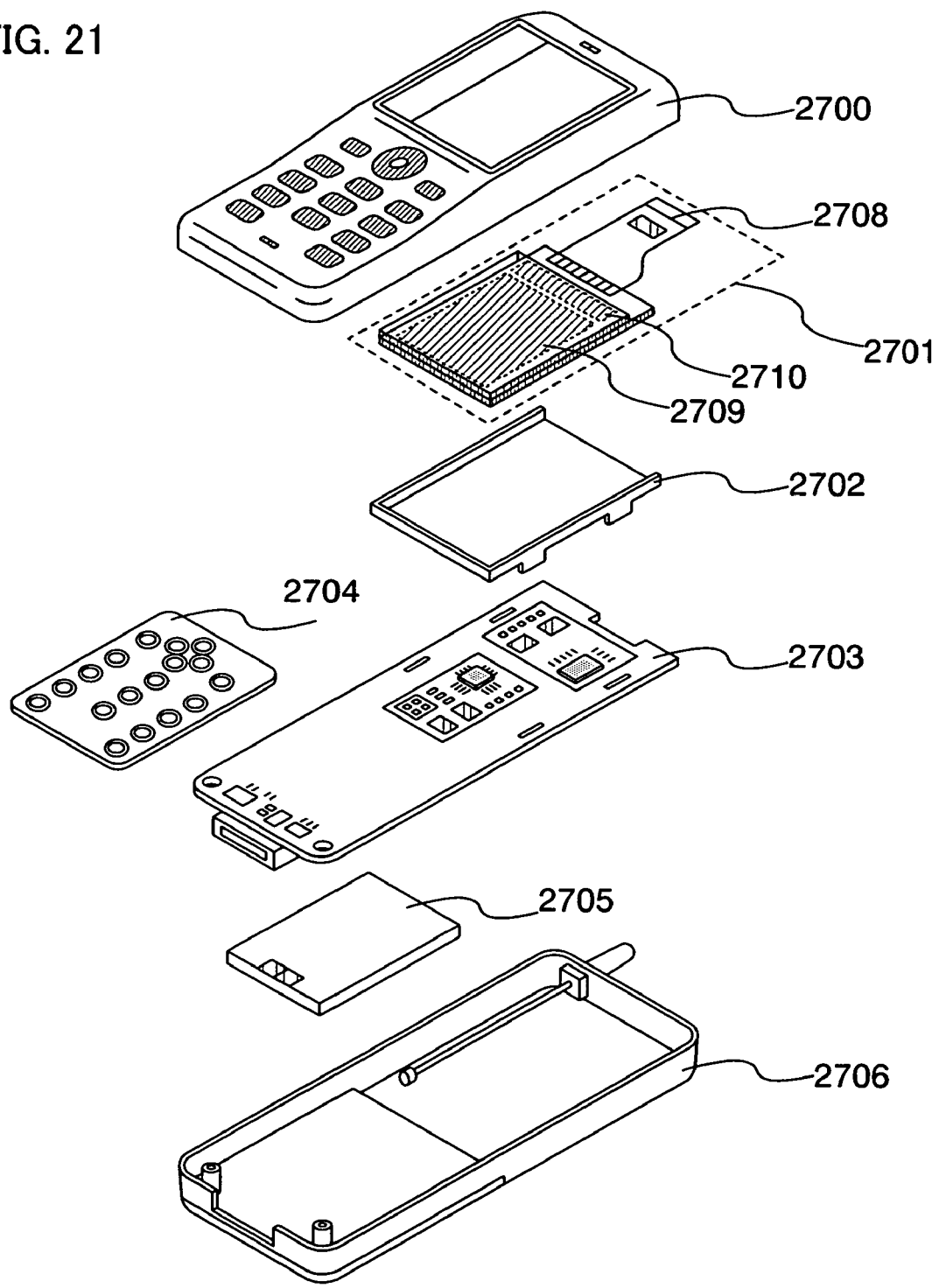
FIG. 21 is a diagram showing a structure of a semiconductor device of the invention.

A mobile phone set includes housings 2700 and 2706, a panel 2701, a housing 2702, a printed wiring board 2703, an operating button 2704, and a battery 2705 (see FIG. 21). The panel 2701 has a pixel portion 2709 where a plurality of pixels are arranged in matrix, and a functional circuit portion 2710. These circuits are sealed with a pair of substrates. The panel 2701 is incorporated in the housing 2702 in a detachable manner, and the housing 2702 is fitted into the printed wiring board 2703. The housing 2702 is appropriately changed in shape and size in accordance with an electronic apparatus incorporating the panel 2701. A plurality of IC chips are mounted on the printed wiring board 2703, which correspond to one or more of a central processing unit (CPU), a controller circuit, a power supply circuit, a buffer amplifier, a source driver, and a gate driver. A module refers to a state where the printed wiring board 2703 is mounted on a panel.

The functional circuit portion 2710 includes the PLL circuit described in the aforementioned embodiment mode as well as a driver circuit for controlling the pixel portion 2709. The PLL circuit has a function of keeping the frequency of an outputting signal constant and controlling the frequency of an outputting signal. For example, when the PLL circuit increases the frequency of a signal and a signal with the increased frequency is supplied to a driver circuit, the driver circuit can operate at a higher speed. The PLL circuit also has a function of outputting a signal with a correct frequency by synchronizing an inputted signal with an average frequency even when the frequency of the inputted signal is incorrect. Therefore, even when the frequency of an inputted signal is incorrect, a signal with a correct frequency can be supplied to the pixel portion 2709 and the driver circuit, thereby a desired image can be displayed in the pixel portion 2709. As a result, a semiconductor device with high function, multifunction and high added value can be achieved.

The panel 2701 is connected to the printed wiring board 2703 through a connecting film 2708. The panel 2701, the housing 2702 and the printed wiring board 2703 are stored in the housings, 2700 and 2706 together with the operating button 2704 and the battery 2705. The pixel portion 2709 included in the panel 2701 is arranged so as to be seen from an opening that is provided in the housing 2700.

It is to be noted that the housings 2700 and 2706 show examples of appearance of the mobile phone, and electronic apparatuses according to this embodiment may have various modes depending on a function and a usage. Examples of the modes of the electronic apparatuses are thus described below with reference to FIGS. 22A to 22F.

Figure 22A:
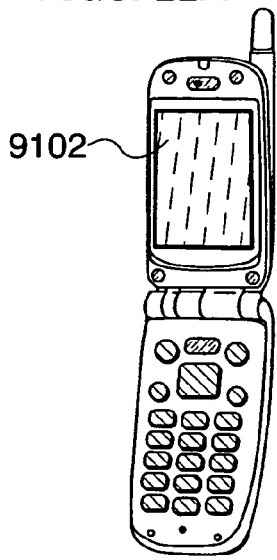
FIGS. 22A to 22F are diagrams each showing a structure of a semiconductor device of the invention.
Figure 22B:
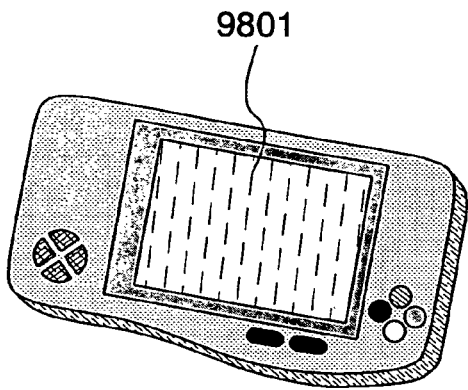
Figure 22C:
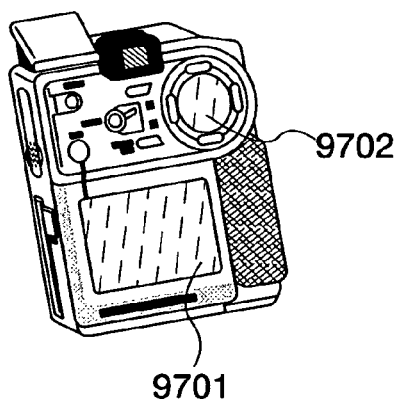
Figure 22D:
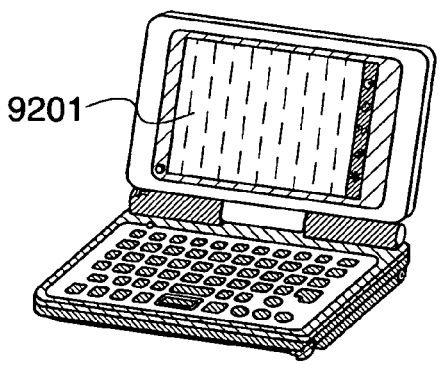
Figure 22E:
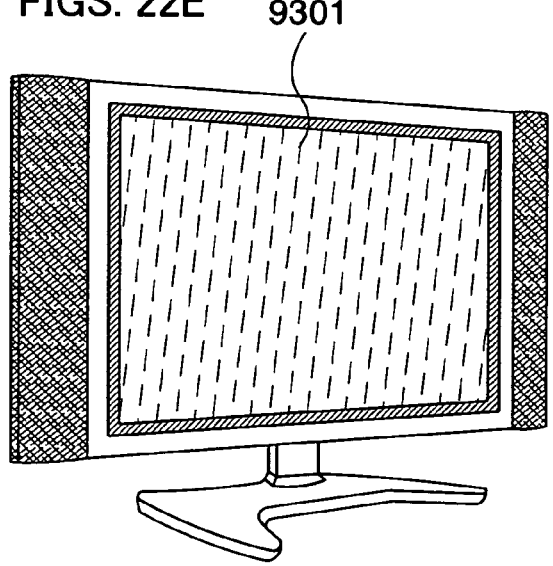
Figure 22F:
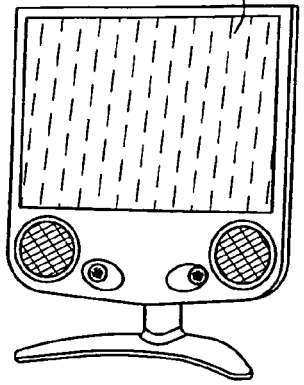

A mobile phone set that is a portable terminal includes a pixel portion 9102 and the like (see FIG. 22A). A portable game machine that is a portable terminal includes a pixel portion 9801 and the like (see FIG. 22B). A digital video camera includes pixel portions 9701 and 9702, and the like (see FIG. 22C). A PDA (Personal Digital Assistant) that is a portable information terminal includes a pixel portion 9201 and the like (see FIG. 22D). A television set includes a pixel portion 9301 and the like (see FIG. 22E). A monitor device includes a pixel portion 9401 and the like (see FIG. 22F).

The invention can be applied to various electronic apparatuses such as a mobile phone set (also called a mobile phone device or simply called a mobile phone), a PDA, an electronic notebook, and a portable game machine, each of which is a portable terminal, as well as a television set (also called a TV or a television receiver), a display (also called a monitor device), a digital camera, a digital video camera, an audio reproducing device such as a car audio set, a home game machine and the like. This embodiment can be freely combined with other embodiment mode and embodiments.

Although a thin film transistors is shown above as the element constituting a voltage control oscillator, an element constituting a voltage control oscillator are not limited to a thin film transistor in the invention, and a transistor such as a MOS transistor and the like may be used as well.

This application is based on Japanese Patent Application serial No. 2005-055183 filed in Japan Patent Office on Feb. 28, 2005, the entire contents of which are hereby incorporated by reference.

What is claimed is:

1. A semiconductor device comprising:
   a low potential power supply;
   a high potential power supply; and
   a voltage controlled oscillator, the voltage controlled oscillator comprising:
   a first circuit comprising a first N-type transistor and a first P-type transistor;
   a second circuit comprising a second N-type transistor;
   a third circuit comprising a second P-type transistor; and
   a fourth circuit comprising a third N-type transistor and a third P-type transistor,
   wherein one of a source and a drain of the first N-type transistor is electrically connected to one of a source and a drain of the first P-type transistor,
   wherein the other of the source and the drain of the first N-type transistor is electrically connected to one of a source and a drain of the second N-type transistor,
   wherein the other of the source and the drain of the first P-type transistor is electrically connected to one of a source and a drain of the second P-type transistor,
   wherein one of a source and a drain of the third N-type transistor is electrically connected to one of a source and a drain of the third P-type transistor,
   wherein the other of the source and the drain of the second N-type transistor and the other of the source and the drain of the third N-type transistor are electrically connected to the low potential power supply,
   wherein the other of the source and the drain of the second P-type transistor and the other of the source and the drain of the third P-type transistor are electrically connected to the high potential power supply,
   wherein a threshold voltage of the second N-type transistor is lower than that of the first N-type transistor,
   wherein a threshold voltage of the third N-type transistor is lower than that of the first N-type transistor,
   wherein a first signal is inputted to a gate of the second N-type transistor and a gate of the third N-type transistor, and
   wherein a second signal is outputted from the one of the source and the drain of the first N-type transistor and the one of the source and the drain of the first P-type transistor.

2. The semiconductor device according to claim 1,
   wherein the first circuit comprises a plurality of the first N-type transistors and a plurality of the first P-type transistors,
   wherein the second circuit comprises a plurality of the second N-type transistors,
   wherein the third circuit comprises a plurality of the second P-type transistors,
   wherein one of a source and a drain of each of the first N-type transistors is electrically connected to one of a source and a drain of each of the first P-type transistors,
   wherein the other of the source and the drain of each of the first N-type transistors is electrically connected to one of a source and a drain of each of the second N-type transistors,
   wherein the other of the source and the drain of each of the first P-type transistors is electrically connected to one of a source and a drain of each of the second P-type transistors,
   wherein the other of the source and the drain of each of the second N-type transistors is electrically connected to the low potential power supply,
   wherein the other of the source and the drain of each of the second P-type transistors is electrically connected to the high potential power supply,
   wherein a threshold voltage of each of the second N-type transistors is lower than that of each of the first N-type transistors, and
   wherein a threshold voltage of the third N-type transistor is lower than that of each of the first N-type transistors.

3. The semiconductor device according to claim 1,
   wherein the first N-type transistor comprises a first semiconductor layer including a first channel forming region,
   wherein the second N-type transistor comprises a second semiconductor layer including a second channel forming region,
   wherein the third N-type transistor comprises a third semiconductor layer including a third channel forming region,
   wherein a concentration of an impurity element imparting N-type conductivity in the second channel forming region is higher than that in the first channel forming region, and
   wherein a concentration of an impurity element imparting N-type conductivity in the third channel forming region is higher than that in the first channel forming region.

4. The semiconductor device according to claim 1,
   wherein the first N-type transistor comprises a first semiconductor layer including a first channel forming region,
   wherein the second N-type transistor comprises a second semiconductor layer including a second channel forming region,
   wherein the third N-type transistor comprises a third semiconductor layer including a third channel forming region,
   wherein a concentration of an impurity element imparting P-type conductivity in the second channel forming region is lower than that in the first channel forming region, and
   wherein a concentration of an impurity element imparting P-type conductivity in the third channel forming region is lower than that in the first channel forming region.

5. The semiconductor device according to claim 1 further comprising a phase comparator, a loop filter and a divider, wherein each of them are electrically connected to the voltage controlled oscillator.

6. The semiconductor device according to claim 1 further comprising a phase comparator, a loop filter and a divider,
   wherein each of them are electrically connected to the voltage controlled oscillator, and
   wherein the first signal is generated at the loop filter, and the second signal is supplied to the divider.

7. The semiconductor device according to claim 1,
   wherein a substrate is formed under the voltage controlled oscillator, and
   wherein the substrate is formed of glass or plastic.

8. The semiconductor device according to claim 1, wherein an antenna that is electrically connected to the voltage controlled oscillator is formed.

9. The semiconductor device according to claim 1,
wherein a pixel portion comprising a plurality of pixels is formed, and each of the plurality of pixels comprises a liquid crystal element or a light emitting element, and
wherein the pixel portion is electrically connected to the voltage controlled oscillator.

10. The semiconductor device according to claim 1, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

11. The semiconductor device according to claim 1,
wherein the first to third N-type transistors are thin film transistors, and
wherein the first to third P-type transistors are thin film transistors.

12. A semiconductor device comprising:
a low potential power supply;
a high potential power supply; and
a voltage controlled oscillator, the voltage controlled oscillator comprising:
a first circuit comprising a first N-type transistor and a P-type transistor; and
a second circuit comprising a second N-type transistor;
wherein one of a source and a drain of the first N-type transistor is electrically connected to one of a source and a drain of the P-type transistor,
wherein the other of the source and the drain of the first N-type transistor is electrically connected to one of a source and a drain of the second N-type transistor,
wherein the other of the source and the drain of the second N-type transistor is electrically connected to the low potential power supply,
wherein the other of the source and the drain of the P-type transistor is electrically connected to the high potential power supply,
wherein a threshold voltage of the second N-type transistor is lower than that of the first N-type transistor,
wherein a first signal is inputted to a gate of the second N-type transistor, and
wherein a second signal is outputted from the one of the source and the drain of the first N-type transistor and the one of the source and the drain of the P- type transistor.

13. A semiconductor device according to claim 12,
wherein the first circuit comprises a plurality of the first N-type transistors and a plurality of the P-type transistors,
wherein the second circuit comprises a plurality of the second N-type transistors,
wherein one of a source and a drain of each of the first N-type transistors is electrically connected to one of a source and a drain of each of the P-type transistors,
wherein the other of the source and the drain of each of the first N-type m transistors is electrically connected to one of a source and a drain of each of the second N-type transistors,
wherein the other of the source and the drain of each of the second N-type transistors is electrically connected to the low potential power supply,
wherein the other of the source and the drain of each of the P-type transistors is electrically connected to the high potential power supply, and
wherein a threshold voltage of each of the second N-type transistors is lower than that of each of the first N-type transistors.

14. The semiconductor device according to claim 12,
wherein the first N-type transistor comprises a first semiconductor layer including a first channel forming region,
wherein the second N-type transistor comprises a second semiconductor layer including a second channel forming region, and
wherein a concentration of an impurity element imparting N-type conductivity in the second channel forming region is higher than that in the first channel forming region.

15. The semiconductor device according to claim 12,
wherein the first N-type transistor comprises a first semiconductor layer including a first channel forming region,
wherein the second N-type transistor comprises a second semiconductor layer including a second channel forming region, and
wherein a concentration of an impurity element imparting P-type conductivity in the second channel forming region is lower than that in the first channel forming region.

16. The semiconductor device according to claim 12 further comprising a phase comparator, a loop filter and a divider, wherein each of them are electrically connected to the voltage controlled oscillator.

17. The semiconductor device according to claim 12 further comprising a phase comparator, a loop filter and a divider,
wherein each of them are electrically connected to the voltage controlled oscillator, and
wherein the first signal is generated at the loop filter, and the second signal is supplied to the divider.

18. The semiconductor device according to claim 12,
wherein a substrate is formed under the voltage controlled oscillator, and
wherein the substrate is formed of glass or plastic.

19. The semiconductor device according to claim 12, wherein an antenna that is electrically connected to the voltage controlled oscillator is formed.

20. The semiconductor device according to claim 12,
wherein a pixel portion comprising a plurality of pixels is formed, and each of the plurality of pixels comprises a liquid crystal element or a light emitting element, and
wherein the pixel portion is electrically connected to the voltage controlled oscillator.

21. The semiconductor device according to claim 12, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

22. The semiconductor device according to claim 12,
wherein the first to second N-type transistors are thin film transistors, and
wherein the P-type transistor is a thin film transistor.

23. A semiconductor device comprising:
a low potential power supply;
a high potential power supply; and
a voltage controlled oscillator, the voltage controlled oscillator comprising:
a first circuit comprising a first N-type transistor and a first P-type transistor;
a second circuit comprising a second N-type transistor;
a third circuit comprising a second P-type transistor; and a fourth circuit comprising a third N-type transistor and a third P-type transistor;
wherein one of a source and a drain of the first N-type transistor is electrically connected to one of a source and a drain of the first P-type transistor,
wherein the other of the source and the drain of the first N-type transistor is electrically connected to one of a source and a drain of the second N-type transistor,
wherein the other of the source and the drain of the first P-type transistor is electrically connected to one of a source and a drain of the second P-type transistor,
wherein one of a source and a drain of the third N-type transistor is electrically connected to one of a source and a drain of the third P-type transistor,
wherein the other of the source and the drain of the second N-type transistor and the other of the source and the drain of the third N-type transistor are electrically connected to the low potential power supply,
wherein the other of the source and the drain of the second P-type transistor and the other of the source and the drain of the third P-type transistor are electrically connected to the high potential power supply,
wherein a threshold voltage of the second P-type transistor is higher than that of the first P-type transistor,
wherein a threshold voltage of the third P-type transistor is higher than that of the first P-type transistor,
wherein a first signal is inputted to a gate of the second P-type transistor and a gate of the third P-type transistor, and
wherein a second signal is outputted from the one of the source and the drain of the first N-type transistor and the one of the source and the drain of the first P- type transistor.

24. A semiconductor device according to claim 23,
wherein the first circuit comprises a plurality of the first N-type transistors and a plurality of the first P-type thin film transistors,
wherein the second circuit comprising a plurality of the second N-type transistors,
wherein the third circuit comprises a plurality of the second P-type transistors,
wherein one of a source and a drain of each of the first N-type transistors is electrically connected to one of a source and a drain of each of the first P-type transistors,
wherein the other of the source and the drain of each of the first N-type transistors is electrically connected to one of a source and a drain of each of the second N-type transistors,
wherein the other of the source and the drain of each of the first P-type transistors is electrically connected to one of a source and a drain of each of the second P-type transistors,
wherein the other of the source and the drain of each of the second N-type transistors is electrically connected to the low potential power supply,
wherein the other of the source and the drain of each of the second P-type transistors is electrically connected to the high potential power supply,
wherein a threshold voltage of each of the second P-type transistors is higher than that of each of the first P-type thin film transistors, and
wherein a threshold voltage of the third P-type transistor is higher than that of each of the first P-type transistors.

25. The semiconductor device according to claim 23,
wherein the first P-type transistor includes a first semiconductor layer including a first channel forming region,
wherein the second P-type transistor includes a second semiconductor layer including a second channel forming region,
wherein the third P-type transistor includes a third semiconductor layer including a third channel forming region,
wherein a concentration of an impurity element imparting P-type conductivity in the second channel forming region is higher than that in the first channel forming region, and
wherein a concentration of an impurity element imparting P-type conductivity in the third channel forming region is higher than that in the first channel forming region.

26. The semiconductor device according to claim 23,
wherein the first P-type transistor includes a first semiconductor layer including a first channel forming region,
wherein the second P-type transistor includes a second semiconductor layer including a second channel forming region,
wherein the third P-type transistor includes a third semiconductor layer including a third channel forming region,
wherein a concentration of an impurity element imparting N-type conductivity in the second channel forming region is lower than that in the first channel forming region, and
wherein a concentration of an impurity element imparting N-type conductivity in the third channel forming region is lower than that in the first channel forming region.

27. The semiconductor device according to claim 23 further comprising a phase comparator, a loop filter and a divider, wherein each of them are electrically connected to the voltage controlled oscillator.

28. The semiconductor device according to claim 23 further comprising a phase comparator, a loop filter and a divider,
wherein each of them are electrically connected to the voltage controlled oscillator, and
wherein the first signal is generated at the loop filter, and the second signal is supplied to the divider.

29. The semiconductor device according to claim 23,
wherein a substrate is formed under the voltage controlled oscillator, and
wherein the substrate is formed of glass or plastic.

30. The semiconductor device according to claim 23, wherein an antenna that is electrically connected to the voltage controlled oscillator is formed.

31. The semiconductor device according to claim 23,
wherein a pixel portion comprising a plurality of pixels is formed, and each of the plurality of pixels comprises a liquid crystal element or a light emitting element, and
wherein the pixel portion is electrically connected to the voltage controlled oscillator.

32. The semiconductor device according to claim 23, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

33. The semiconductor device according to claim 23,
wherein the first to third N-type transistors are thin film transistors, and
wherein the first to third P-type transistors are thin film transistors.

34. A semiconductor device comprising:
a low potential power supply;

a high potential power supply; and a voltage controlled oscillator, the voltage controlled oscillator comprising:

a first circuit comprising an N-type transistor and a first P-type transistor; and a second circuit comprising a second P-type transistor, wherein one of a source and a drain of the first P-type transistor is electrically connected to one of a source and a drain of the N-type transistor, wherein the other of the source and the drain of the first P-type transistor is electrically connected to one of a source and a drain of the second P-type transistor, wherein the other of the source and the drain of the second P-type transistor is electrically connected to the high potential power supply, wherein the other of the source and the drain of the N-type transistor is electrically connected to the low potential power supply, wherein a threshold voltage of the second P-type transistor is higher than that of the first P-type transistor, wherein a first signal is inputted to a gate of the second P-type transistor, and wherein a second signal is outputted from the one of the source and the drain of the N-type transistor and the one of the source and the drain of the first P-type transistor.

35. A semiconductor device according to claim 34, wherein the first circuit comprises a plurality of the N-type transistors and a plurality of the first P-type transistors, wherein the second circuit comprises a plurality of the second P-type transistors, wherein one of a source and a drain of each of the first P-type transistors is electrically connected to one of a source and a drain of each of the N-type transistors, wherein the other of the source and the drain of each of the first P-type transistors is electrically connected to one of a source and a drain of each of the second P-type transistors, wherein the other of the source and the drain of each of the second P-type transistors is electrically connected to the high potential power supply, wherein the other of the source and the drain of each of the N-type transistors is electrically connected to the low potential power supply, and wherein a threshold voltage of each of the second P-type transistors is higher than that of each of the first P-type transistors.

36. The semiconductor device according to claim 34, wherein the first P-type transistor comprises a first semiconductor layer including a first channel forming region, wherein the second P-type transistor comprises a second semiconductor layer including a second channel forming region, and wherein a concentration of an impurity element imparting P-type conductivity in the second channel forming region is higher than that in the first channel forming region.

37. The semiconductor device according to claim 34, wherein the first P-type transistor comprises a first semiconductor layer including a first channel forming region, wherein the second P-type transistor comprises a second semiconductor layer including a second channel forming region, and wherein a concentration of an impurity element imparting N-type conductivity in the second channel forming region is lower than that in the first channel forming region.

38. The semiconductor device according to claim 34 further comprising a phase comparator, a loop filter and a divider, wherein each of them are electrically connected to the voltage controlled oscillator.

39. The semiconductor device according to claim 34 further comprising a phase comparator, a loop filter and a divider, wherein each of them are electrically connected to the voltage controlled oscillator, and wherein the first signal is generated at the loop filter, and the second signal is supplied to the divider.

40. The semiconductor device according to claim 34, wherein a substrate is formed under the voltage controlled oscillator, and wherein the substrate is formed of glass or plastic.

41. The semiconductor device according to claim 34, wherein an antenna that is electrically connected to the voltage controlled oscillator is formed.

42. The semiconductor device according to claim 34, wherein a pixel portion comprising a plurality of pixels is formed, and each of the plurality of pixels comprises a liquid crystal element or a light emitting element, and wherein the pixel portion is electrically connected to the voltage controlled oscillator.

43. The semiconductor device according to claim 34, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

44. The semiconductor device according to claim 34, wherein the N-type transistor is a thin film transistor, and wherein the first to second P-type transistors are thin film transistors.

45. A semiconductor device comprising:

a low potential power supply;

a high potential power supply; and a voltage controlled oscillator, the voltage controlled oscillator comprising:

a first circuit comprising a first N-type transistor and a first P-type transistor;

a second circuit comprising a second N-type transistor;

a third circuit comprising a second P-type transistor; and a fourth circuit comprising a third N-type transistor and a third P-type transistor, wherein one of a source and a drain of the first N-type transistor is electrically connected to one of a source and a drain of the first P-type transistor, wherein the other of the source and the drain of the first N-type transistor is electrically connected to one of a source and a drain of the second N-type transistor, wherein the other of the source and the drain of the first P-type transistor is electrically connected to one of a source and a drain of the second P-type transistor, wherein one of a source and a drain of the third N-type transistor is electrically connected to one of a source and a drain of the third P-type transistor, wherein the other of the source and the drain of the second N-type transistor and the other of the source and the drain of the third N-type transistor are electrically connected to the low potential power supply, wherein the other of the source and the drain of the second P-type transistor and the other of the source and the drain of the third P-type transistor are electrically connected to the high potential power supply, wherein a channel length of the second N-type transistor is shorter than that of the first N-type transistor, wherein a channel length of the third N-type transistor is shorter than that of the first N-type transistor, wherein a first signal is inputted to a gate of the second N-type transistor and a gate of the third N-type transistor, and wherein a second signal is outputted from the one of the source and the drain of the first N-type transistor and the one of the source and the drain of the first P-type transistor.

46. The semiconductor device according to claim 45, wherein the first circuit comprises a plurality of the first N-type transistors and a plurality of the first P-type transistors, wherein the second circuit comprises a plurality of the second N-type transistors, wherein the third circuit comprises a plurality of the second P-type transistors, wherein one of a source and a drain of each of the first N-type transistors is electrically connected to one of a source and a drain of each of the first P-type transistors, wherein the other of the source and the drain of each of the first N-type transistors is electrically connected to one of a source and a drain of each of the second N-type transistors, wherein the other of the source and the drain of each of the first P-type transistors is electrically connected to one of a source and a drain of each of the second P-type transistors, wherein the other of the source and the drain of each of the second N-type transistors is electrically connected to the low potential power supply, wherein the other of the source and the drain of each of the second P-type transistors is electrically connected to the high potential power supply, wherein a channel length of each of the second N-type transistors is shorter than that of each of the first N-type transistors, and wherein a channel length of the third N-type transistor is shorter than that of each of the first N-type transistors.

47. The semiconductor device according to claim 45, wherein the first N-type transistor comprises a first semiconductor layer including a first channel forming region, wherein the second N-type transistor comprises a second semiconductor layer including a second channel forming region, wherein the third N-type transistor comprises a third semiconductor layer including a third channel forming region, wherein a concentration of an impurity element imparting N-type conductivity in the second channel forming region is higher than that in the first channel forming region, and wherein a concentration of an impurity element imparting N-type conductivity in the third channel forming region is higher than that in the first channel forming region.

48. The semiconductor device according to claim 45, wherein the first N-type transistor comprises a first semiconductor layer including a first channel forming region, wherein the second N-type transistor comprises a second semiconductor layer including a second channel forming region, wherein the third N-type transistor comprises a third semiconductor layer including a third channel forming region, wherein a concentration of an impurity element imparting P-type conductivity in the second channel forming region is lower than that in the first channel forming region, and wherein a concentration of an impurity element imparting P-type conductivity in the third channel forming region is lower than that in the first channel forming region.

49. The semiconductor device according to claim 45 further comprising a phase comparator, a loop filter and a divider, wherein each of them are electrically connected to the voltage controlled oscillator.

50. The semiconductor device according to claim 45 further comprising a phase comparator, a loop filter and a divider, wherein each of them are electrically connected to the voltage controlled oscillator, and wherein the first signal is generated at the loop filter, and the second signal is supplied to the divider.

51. The semiconductor device according to claim 45, wherein a substrate is formed under the voltage controlled oscillator, and wherein the substrate is formed of glass or plastic.

52. The semiconductor device according to claim 45, wherein an antenna that is electrically connected to the voltage controlled oscillator is formed.

53. The semiconductor device according to claim 45, wherein a pixel portion comprising a plurality of pixels is formed, and each of the plurality of pixels comprises a liquid crystal element or a light emitting element, and wherein the pixel portion is electrically connected to the voltage controlled oscillator.

54. The semiconductor device according to 45, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

55. The semiconductor device according to claim 45, wherein the first to third N-type transistors are thin film transistors, and wherein the first to third P-type transistors are thin film transistors.

56. A semiconductor device comprising:

a low potential power supply;

a high potential power supply; and a voltage controlled oscillator, the voltage controlled oscillator comprising:

a first circuit comprising a first N-type transistor and a P-type transistor; and a second circuit comprising a second N-type transistor;

wherein one of a source and a drain of the first N-type transistor is electrically connected to one of a source and a drain of the P-type transistor, wherein the other of the source and the drain of the first N-type transistor is electrically connected to one of a source and a drain of the second N-type transistor, wherein the other of the source and the drain of the second N-type transistor is electrically connected to the low potential power supply, wherein the other of the source and the drain of the P-type transistor is electrically connected to the high potential power supply, wherein a channel length of the second N-type transistor is shorter than that of the first N-type transistor, wherein a first signal is inputted to a gate of the second N-type transistor, and wherein a second signal is outputted from the one of the source and the drain of the first N-type transistor and the one of the source and the drain of the P-type transistor.

57. A semiconductor device according to claim 56,
wherein the first circuit comprises a plurality of the first N-type transistors and a plurality of the P-type transistors,
wherein the second circuit comprises a plurality of the second N-type transistors,
wherein one of a source and a drain of each of the first N-type transistors is electrically connected to one of a source and a drain of each of the P-type transistors,
wherein the other of the source and the drain of each of the first N-type transistors is electrically connected to one of a source and a drain of each of the second N-type transistors,
wherein the other of the source and the drain of each of the second N-type transistors is electrically connected to the low potential power supply,
wherein the other of the source and the drain of each of the P-type transistors is electrically connected to the high potential power supply, and
wherein a threshold voltage of each of the second N-type transistors is lower than that of each of the first N-type transistors.

58. The semiconductor device according to claim 56,
wherein the first N-type transistor comprises a first semiconductor layer including a first channel forming region,
wherein the second N-type transistor comprises a second semiconductor layer including a second channel forming region, and
wherein a concentration of an impurity element imparting N-type conductivity in the second channel forming region is higher than that in the first channel forming region.

59. The semiconductor device according to claim 56,
wherein the first N-type transistor comprises a first semiconductor layer including a first channel forming region,
wherein the second N-type transistor comprises a second semiconductor layer including a second channel forming region, and
wherein a concentration of an impurity element imparting P-type conductivity in the second channel forming region is lower than that in the first channel forming region.

60. The semiconductor device according to claim 56 further comprising a phase comparator, a loop filter and a divider, wherein each of them are electrically connected to the voltage controlled oscillator.

61. The semiconductor device according to claim 56 further comprising a phase comparator, a loop filter and a divider,
wherein each of them are electrically connected to the voltage controlled oscillator, and
wherein the first signal is generated at the loop filter, and the second signal is supplied to the divider.

62. The semiconductor device according to claim 56,
wherein a substrate is formed under the voltage controlled oscillator, and
wherein the substrate is formed of glass or plastic.

63. The semiconductor device according to claim 56, wherein an antenna that is electrically connected to the voltage controlled oscillator is formed.

64. The semiconductor device according to claim 56, wherein a pixel portion comprising a plurality of pixels is formed, and each of the plurality of pixels comprises a liquid crystal element or a light emitting element, and
wherein the pixel portion is electrically connected to the voltage controlled oscillator.

65. The semiconductor device according to claim 56, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

66. The semiconductor device according to claim 56,
wherein the first to second N-type transistors are thin film transistors, and
wherein the P-type transistor is a thin film transistor.

67. A semiconductor device comprising:
a low potential power supply;
a high potential power supply; and
a voltage controlled oscillator, the voltage controlled oscillator comprising:
a first circuit comprising a first N-type transistor and a first P-type transistor;
a second circuit comprising a second N-type transistor;
a third circuit comprising a second P-type transistor; and
a fourth circuit comprising a third N-type transistor and a third P-type transistor;
wherein one of a source and a drain of the first N-type transistor is electrically connected to one of a source and a drain of the first P-type transistor,
wherein the other of the source and the drain of the first N-type transistor is electrically connected to one of a source and a drain of the second N-type transistor,
wherein the other of the source and the drain of the first P-type transistor is electrically connected to one of a source and a drain of the second P-type transistor,
wherein one of a source and a drain of the third N-type transistor is electrically connected to one of a source and a drain of the third P-type transistor,
wherein the other of the source and the drain of the second N-type transistor and the other of the source and the drain of the third N-type transistor are electrically connected to the low potential power supply,
wherein the other of the source and the drain of the second P-type transistor and the other of the source and the drain of the third P-type transistor are electrically connected to the high potential power supply,
wherein a channel length of the second P-type transistors is shorter than that of the first P-type transistor,
wherein a channel length of the third P-type transistor is shorter than that of the first P-type transistor,
wherein a first signal is inputted to a gate of the second P-type transistor and a gate of the third P-type transistor, and
wherein a second signal is outputted from the one of the source and the drain of the first N-type transistor and the one of the source and the drain of the first P-type transistor.

68. A semiconductor device according to claim 67,
wherein the first circuit comprises a plurality of the first N-type transistors and a plurality of the first P-type transistors,
wherein the second circuit comprising a plurality of the second N-type transistors,
wherein the third circuit comprises a plurality of the second P-type transistors,
wherein one of a source and a drain of each of the first N-type transistors is electrically connected to one of a source and a drain of each of the first P-type transistors, wherein the other of the source and the drain of each of the first N-type transistors is electrically connected to one of a source and a drain of each of the second N-type transistors, wherein the other of the source and the drain of each of the first P-type transistors is electrically connected to one of a source and a drain of each of the second P-type transistors, wherein the other of the source and the drain of each of the second N-type transistors is electrically connected to the low potential power supply, wherein the other of the source and the drain of each of the second P-type transistors is electrically connected to the high potential power supply, wherein a threshold voltage of each of the second P-type transistors is higher than that of each of the first P-type transistors, and wherein a threshold voltage of the third P-type m transistor is higher than that of each of the first P-type transistors.

69. The semiconductor device according to claim 67,
wherein the first P-type transistor includes a first semiconductor layer including a first channel forming region,
wherein the second P-type transistor includes a second semiconductor layer including a second channel forming region,
wherein the third P-type transistor includes a third semiconductor layer including a third channel forming region,
wherein a concentration of an impurity element imparting P-type conductivity in the second channel forming region is higher than that in the first channel forming region, and
wherein a concentration of an impurity element imparting P-type conductivity in the third channel forming region is higher than that in the first channel forming region.

70. The semiconductor device according to claim 67,
wherein the first P-type transistor includes a first semiconductor layer including a first channel forming region,
wherein the second P-type transistor includes a second semiconductor layer including a second channel forming region,
wherein the third P-type transistor includes a third semiconductor layer including a third channel forming region,
wherein a concentration of an impurity element imparting N-type conductivity in the second channel forming region is lower than that in the first channel forming region, and
wherein a concentration of an impurity element imparting N-type conductivity in the third channel forming region is lower than that in the first channel forming region.

71. The semiconductor device according to claim 67 further comprising a phase comparator, a loop filter and a divider, wherein each of them are electrically connected to the voltage controlled oscillator.

72. The semiconductor device according to claim 67 further comprising a phase comparator, a loop filter and a divider,
wherein each of them are electrically connected to the voltage controlled oscillator, and
wherein the first signal is generated at the loop filter, and the second signal is supplied to the divider.

73. The semiconductor device according to claim 67,
wherein a substrate is formed under the voltage controlled oscillator, and
wherein the substrate is formed of glass or plastic.

74. The semiconductor device according to claim 67, wherein an antenna that is electrically connected to the voltage controlled oscillator is formed.

75. The semiconductor device according to claim 67,
wherein a pixel portion comprising a plurality of pixels is formed, substrate, and each of the plurality of pixels comprises a liquid crystal element or a light emitting element, and
wherein the pixel portion is electrically connected to the voltage controlled oscillator.

76. The semiconductor device according to claim 67, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

77. The semiconductor device according to claim 67,
wherein the first to third N-type transistors are thin film transistors, and
wherein the first to third P-type transistors are thin film transistors.

78. A semiconductor device comprising:
a low potential power supply;
a high potential power supply; and
a voltage controlled oscillator, the voltage controlled oscillator comprising:
a first circuit comprising an N-type transistor and a first P-type transistor; and
a second circuit comprising a second P-type transistor,
wherein one of a source and a drain of the first P-type transistor is electrically connected to one of a source and a drain of the N-type transistor,
wherein the other of the source and the drain of the first P-type transistor is electrically connected to one of a source and a drain of the second P-type transistor,
wherein the other of the source and the drain of the second P-type transistor is electrically connected to the high potential power supply,
wherein the other of the source and the drain of the N-type transistor is electrically connected to the low potential power supply,
wherein a channel length of the second P-type transistor is shorter than that of the first P-type transistor,
wherein a first signal is inputted to a gate of the second P-type transistor, and
wherein a second signal is outputted from the one of the source and the drain of the N-type transistor and the one of the source and the drain of the first P-type transistor.

79. A semiconductor device according to claim 78,
wherein the first circuit comprises a plurality of the N-type transistors and a plurality of the first P-type transistors,
wherein the second circuit comprises a plurality of the second P-type transistors,
wherein one of a source and a drain of each of the first P-type transistors is electrically connected to one of a source and a drain of each of the N-type transistors,
wherein the other of the source and the drain of each of the first P-type transistors is electrically connected to one of a source and a drain of each of the second P-type transistors,
wherein the other of the source and the drain of each of the second P-type transistors is electrically connected to the high potential power supply,
wherein the other of the source and the drain of each of the N-type transistors is electrically connected to the low potential power supply, and wherein a threshold voltage of each of the second P-type transistors is higher than that of each of the first P-type transistors.

80. The semiconductor device according to claim 78,
wherein the first P-type transistor comprises a first semiconductor layer including a first channel forming region,
wherein the second P-type transistor comprises a second semiconductor layer including a second channel forming region, and
wherein a concentration of an impurity element imparting P-type conductivity in the second channel forming region is higher than that in the first channel forming region.

81. The semiconductor device according to claim 78,
wherein the first P-type transistor comprises a first semiconductor layer including a first channel forming region,
wherein the second P-type transistor comprises a second semiconductor layer including a second channel forming region, and
wherein a concentration of an impurity element imparting N-type conductivity in the second channel forming region is lower than that in the first channel forming region.

82. The semiconductor device according to claim 78 further comprising a phase comparator, a loop filter and a divider, wherein each of them are electrically connected to the voltage controlled oscillator.

83. The semiconductor device according to claim 78 further comprising a phase comparator, a loop filter and a divider,
wherein each of them are electrically connected to the voltage controlled oscillator, and
wherein the first signal is generated at the loop filter, and the second signal is supplied to the divider.

84. The semiconductor device according to claim 78,
wherein a substrate is formed under the voltage controlled oscillator, and
wherein the substrate is formed of glass or plastic.

85. The semiconductor device according to claim 78, wherein an antenna that is electrically connected to the voltage controlled oscillator is formed.

86. The semiconductor device according to claim 78,
wherein a pixel portion comprising a plurality of pixels is formed, and each of the plurality of pixels comprises a liquid crystal element or a light emitting element, and
wherein the pixel portion is electrically connected to the voltage controlled oscillator.

87. The semiconductor device according to claim 78, wherein the semiconductor device is incorporated into an electronic apparatus selected from the group consisting of a mobile phone, a PDA, an electronic notebook, a portable game machine, a TV, a display, a digital camera, a digital video camera, a car audio set, a home game machine, and IC card.

88. The semiconductor device according to claim 78,
wherein the N-type transistor is a thin film transistor, and
wherein the first to second P-type transistors are thin film transistors.

* * * * *

UNITED STATES PATENT AND TRADEMARK OFFICE
CERTIFICATE OF CORRECTION

| | |
|---|---|
| PATENT NO. | : 8,106,594 B2 |
| APPLICATION NO. | : 11/354841 |
| DATED | : January 31, 2012 |
| INVENTOR(S) | : Kiyoshi Kato et al. |

It is certified that error appears in the above-identified patent and that said Letters Patent is hereby corrected as shown below:

At column 27, claim 24, lines 37 and 38, "P-type thin film" should be --P-type--;

At column 27, claim 24, lines 61 and 62, "P-type thin film" should be --P-type--;

At column 32, claim 54, line 33, "45" should be --claim 45--;

At column 36, claim 75, line 6, please delete "substrate,".

Signed and Sealed this
Twenty-fifth Day of September, 2012

David J. Kappos
*Director of the United States Patent and Trademark Office*